(12) United States Patent
Xu et al.

(10) Patent No.: US 11,728,340 B2
(45) Date of Patent: Aug. 15, 2023

(54) SINGLE DIFFUSION BREAK ISOLATION FOR GATE-ALL-AROUND FIELD-EFFECT TRANSISTOR DEVICES

(71) Applicant: International Business Machines Corporation, Armonk, NY (US)

(72) Inventors: Wenyu Xu, Albany, NY (US); Xin Miao, Slingerlands, NY (US); Chen Zhang, Guilderland, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 17/137,041

(22) Filed: Dec. 29, 2020

(65) Prior Publication Data

US 2021/0118878 A1 Apr. 22, 2021

Related U.S. Application Data

(62) Division of application No. 16/428,566, filed on May 31, 2019, now Pat. No. 10,985,161.

(51) Int. Cl.
*H01L 27/088* (2006.01)
*H01L 29/78* (2006.01)
(Continued)

(52) U.S. Cl.
CPC .... *H01L 27/0886* (2013.01); *H01L 21/76224* (2013.01); *H01L 21/823431* (2013.01);
(Continued)

(58) Field of Classification Search
CPC ........... H01L 27/0886; H01L 21/76224; H01L 21/823431; H01L 29/0653; H01L 29/785;
(Continued)

(56) References Cited

U.S. PATENT DOCUMENTS 8,846,491 B1 9/2014 Pham et al.
9,171,752 B1 10/2015 Wu et al.
(Continued)

FOREIGN PATENT DOCUMENTS

CN 108155101 A 6/2018

OTHER PUBLICATIONS

Kangguo Cheng, "(Invited) FinFET Technology," ECS Transactions, Oct. 1-5, 2017, pp. 17-31, vol. 80, No. 4.
List of IBM Patents or Patent Applications Treated as Related.

*Primary Examiner* — Cuong B Nguyen
(74) *Attorney, Agent, or Firm* — Samuel Waldbaum; Ryan, Mason & Lewis, LLP

(57) ABSTRACT

Devices and methods are provided for forming single diffusion break isolation structures for integrated circuit devices including gate-all-around FET devices such as nanosheet FET devices and nanowire FET devices. For example, a semiconductor integrated circuit device includes first and second gate-all-around field-effect transistor devices disposed in first and second device regions, respectively, of a semiconductor substrate. A single diffusion break isolation structure is disposed between the first and second device regions. The single diffusion break isolation structure includes a dummy gate structure disposed on the semiconductor substrate between a first source/drain layer of the first gate-all-around field-effect transistor device and a second source/drain layer of the second gate all-around field-effect transistor device. The single diffusion break isolation structure is configured to electrically isolate the first and second source/drain layers.

15 Claims, 18 Drawing Sheets

(51) Int. Cl.
*H01L 21/762* (2006.01)
*H01L 21/8234* (2006.01)
*H01L 29/06* (2006.01)

(52) U.S. Cl.
CPC ........ *H01L 29/0653* (2013.01); *H01L 29/785* (2013.01); *H01L 2029/7858* (2013.01)

(58) Field of Classification Search
CPC ..... H01L 2029/7858; H01L 21/823437; H01L 21/823481; H01L 27/088; H01L 29/0673; H01L 29/42392; H01L 29/78696; H01L 29/66439; H01L 29/775; B82Y 10/00
See application file for complete search history.

(56) References Cited

U.S. PATENT DOCUMENTS

| | | |
|---|---|---|
| 9,412,616 B1 | 8/2016 | Xie et al. |
| 9,570,442 B1 | 2/2017 | Liu et al. |
| 9,660,022 B2 | 5/2017 | Liou et al. |
| 9,847,423 B1 | 12/2017 | Wei |
| 10,002,943 B2 | 6/2018 | Hong et al. |
| 2015/0021695 A1 | 1/2015 | Hu et al. |
| 2016/0071848 A1 | 3/2016 | Sengupta et al. |
| 2016/0225762 A1 | 8/2016 | Zang et al. |
| 2018/0144986 A1 | 5/2018 | Zhang et al. |
| 2018/0315817 A1 | 11/2018 | Van Dal et al. |
| 2019/0058036 A1 | 2/2019 | Smith et al. |
| 2020/0006559 A1 | 1/2020 | Mehandru et al. |

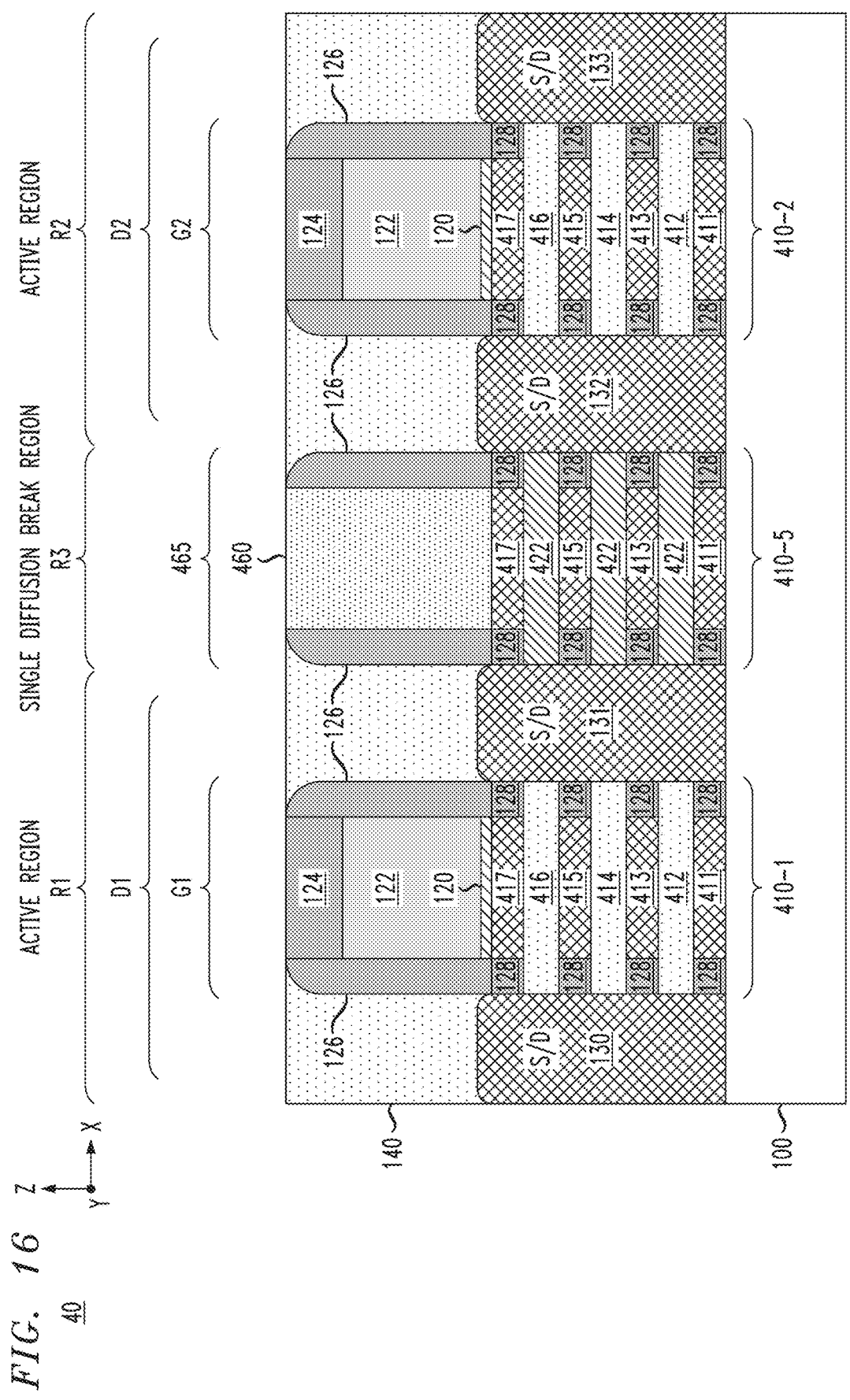

SINGLE DIFFUSION BREAK ISOLATION FOR GATE-ALL-AROUND FIELD-EFFECT TRANSISTOR DEVICES

TECHNICAL FIELD

This disclosure relates generally to semiconductor fabrication techniques and, in particular, to techniques for isolating gate-all-around (GAA) field-effect transistor (FET) devices such as nanosheet FET devices.

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, FinFET devices, etc., are a viable option for continued CMOS scaling. In general, a nanowire FET device comprises a device channel which comprises one or more nanowire layers in a stacked configuration, wherein each nanowire comprises an elongated semiconductor channel layer that has a width which is substantially the same as a thickness of the elongated semiconductor channel layer. A nanosheet FET device is similar to a nanowire FET device sheet in that a device channel comprises one or more nanosheet channel layers in a stacked configuration, but wherein each nanosheet channel layer has a width which is substantially greater than a thickness of the nanosheet channel layer. In GAA FET devices such as nanowire/nanosheet FET devices, the gate material is formed to surround all sides of the active channel layers of such FET devices. In addition, with nanowire/nanosheet FET devices, a common gate structure is formed above and below each nanowire/nanosheet layer in the stacked configuration, thereby increasing the FET device width (or channel width), and thus the drive current, for a given footprint area.

The FET devices formed in different active areas of a semiconductor integrated circuit device must be electrically isolated from one another to properly form an integrated circuit. Various techniques are used isolate active device areas comprising cells/arrays of FET devices. For example, shallow trench isolation methods can be used to form shallow trench isolation regions between active device regions. However, the formation of shallow isolation regions and structures can consume a significant amount of valuable footprint area on the substrate. This becomes increasing problematic with smaller scaling and increasing device packing densities, wherein it can be difficult to form such isolation structures. Within the semiconductor fabrication industry, other types of isolation structures/regions that may be formed are referred to as "diffusion breaks." Such diffusion breaks are formed with isolation material disposed between active device regions. A double diffusion break (DDB) refers to an isolation structure having a lateral width (in a current transport direction or gate length direction of FET devices) between two active regions which approximately corresponds to the lateral width of two gate structures of the FET devices. A single diffusion break (SDB) refers to an isolation structure having a lateral width (in the current transport direction or gate length direction of the FET devices) between two active regions is less than the lateral width of a single gate structure of the FET devices.

The use of DDB isolation structures consumes significantly more footprint space on a substrate as compared to SDB isolation structures, thereby leading to reduced packing densities.

SUMMARY

Embodiments of the invention include methods for forming single diffusion break isolation structures for integrated circuit devices comprising gate-all-around FET devices such as nanosheet FET devices and nanowire FET devices.

For example, an exemplary embodiment includes a semiconductor integrated circuit device which comprises a first gate-all-around field-effect transistor device disposed in a first device region of a semiconductor substrate, a second gate-all-around field-effect transistor device disposed in a second device region of the semiconductor substrate, and a single diffusion break isolation structure disposed between the first and second device regions. The single diffusion break isolation structure comprises a dummy gate structure disposed on the semiconductor substrate between a first source/drain layer of the first gate-all-around field-effect transistor device and a second source/drain layer of the second gate all-around field-effect transistor device, wherein the single diffusion break isolation structure is configured to electrically isolate the first and second source/drain layers.

Another embodiment includes a method for fabricating a semiconductor integrated circuit device, which comprises forming a first gate-all-around field-effect transistor device in a first device region of a semiconductor substrate, forming a second gate-all-around field-effect transistor device in a second device region of the semiconductor substrate, and forming a single diffusion break isolation structure between the first and second device regions. The single diffusion break isolation structure comprises a dummy gate structure formed on the semiconductor substrate between a first source/drain layer of the first gate-all-around field-effect transistor device and a second source/drain layer of the second gate all-around field-effect transistor device, wherein the single diffusion break isolation structure is configured to electrically isolate the first and second source/drain layers.

Other embodiments will be described in the following detailed description of embodiments, which is to be read in conjunction with the accompanying figures.

BRIEF DESCRIPTION OF THE DRAWINGS

FIGS. 1A through 7 schematically illustrate a method for fabricating a semiconductor integrated circuit (IC) device having single diffusion break isolation structures for isolating nanosheet FET devices, according to an exemplary embodiment of the invention, wherein:

FIG. 1A is a schematic top plan view of the semiconductor IC device at an initial stage of fabrication comprising a plurality of nanosheet FET devices formed on a semiconductor substrate;

FIG. 2 is a schematic cross-sectional side view of the intermediate device structure shown in FIGS. 1A and 1B after forming an etch mask which comprises an opening to expose a gate structure in a single diffusion break region and after removing dummy gate layers of the exposed gate structure to expose nanosheet stack structures in the single diffusion break region;

FIG. 3 is a schematic cross-sectional side view of the intermediate device structure shown in FIG. 2 after performing an anisotropic etch process to vertically etch the exposed nanosheet stack structures in the single diffusion break region down to a surface of the semiconductor substrate;

FIG. 4 is a schematic cross-sectional side view of the intermediate device structure shown in FIG. 3 after removing the etch mask and performing an oxidation process to oxidize remaining end portions of nanosheet channel layers of the etched nanosheet stack structures and thereby form oxide layers;

FIG. 5 is a schematic cross-sectional side view of the intermediate device structure shown in FIG. 4 after filling open gate region with insulating material to thereby complete formation of a single diffusion break isolation structure between active device regions;

FIG. 6 is a schematic cross-sectional view of the intermediate device structure shown in FIG. 5 after removing dummy gate capping layers and the dummy gate sacrificial layers of gate structures in active device regions, and after removing sacrificial nanosheet layers to release active nanosheet channel layers of the nanosheet stack structures of the nanosheet FET devices and form open gate regions; and FIG. 7 is a schematic cross-sectional side view of the intermediate device structure shown in FIG. 6 after forming high-k dielectric/metal gate structures for the gate structures of the nanosheet FET devices.

FIGS. 8 through 10 schematically illustrate a method for fabricating a semiconductor IC device having single diffusion break isolation structures for isolating nanosheet FET devices, according to another exemplary embodiment of the invention, wherein:

FIG. 8 is a schematic cross-sectional side view of the intermediate device structure shown in FIG. 3 after removing the etch mask and after removing remaining end portions of nanosheet channel layers of the etched nanosheet stack structures in the single diffusion break region to thereby form recess regions between first embedded sidewall spacers;

FIG. 9 is a schematic cross-sectional side view of the intermediate device structure shown in FIG. 8 after filling the recess regions with dielectric material to form second embedded sidewall spacers between the first embedded sidewall spacers; and FIG. 10 is a schematic cross-sectional side view of the intermediate device structure shown in FIG. 9 after filling the open gate region with insulating material to thereby complete formation of a single diffusion break isolation structure between active device regions.

FIGS. 11 and 12 schematically illustrate a method for fabricating a semiconductor IC device having single diffusion break isolation structures for isolating nanosheet FET devices, according to another exemplary embodiment of the invention, wherein:

FIG. 11 is a schematic cross-sectional side view of the intermediate device structure shown in FIG. 2 after removing the etch mask and after selectively etching away sacrificial nanosheet layers of the exposed nanosheet stack structures in the single diffusion break region; and FIG. 12 is a schematic cross-sectional side view of the intermediate device structure shown in FIG. 11 after oxidizing the exposed nanosheet channel layers in the single diffusion break region to form oxide layers, and after filling the open gate region with insulating material to thereby complete formation of a single diffusion break isolation structure between active device regions.

FIGS. 13A through 16 schematically illustrate a method for fabricating a semiconductor IC device having single diffusion break isolation structures for isolating nanowire FET devices, according to an exemplary embodiment of the invention, wherein:

FIG. 13A is a schematic top plan view of the semiconductor IC device at an initial stage of fabrication comprising a plurality of nanowire FET devices formed on a semiconductor substrate;

FIG. 14 is a schematic cross-sectional side view of the intermediate device structure shown in FIGS. 13A and 13B after removing dummy gate layers of a gate structure in a single diffusion break region to form an open gate region which exposes nanowire stack structures in the single diffusion break region, and after selectively etching away nanowire channel layers of the exposed nanowire stack structures in the single diffusion break region to form spaces between sacrificial nanowire layers of the exposed nanowire stack structures;

FIG. 15 is a schematic cross-sectional side view of the intermediate device structure shown in FIG. 14 after forming dielectric layers in the spaces between the sacrificial nanowire layers; and FIG. 16 is a schematic cross-sectional side view of the intermediate device structure shown in FIG. 15 after filling the open gate region with insulating material to thereby complete formation of a single diffusion break isolation structure between active device regions.

DETAILED DESCRIPTION

Figure 1A:
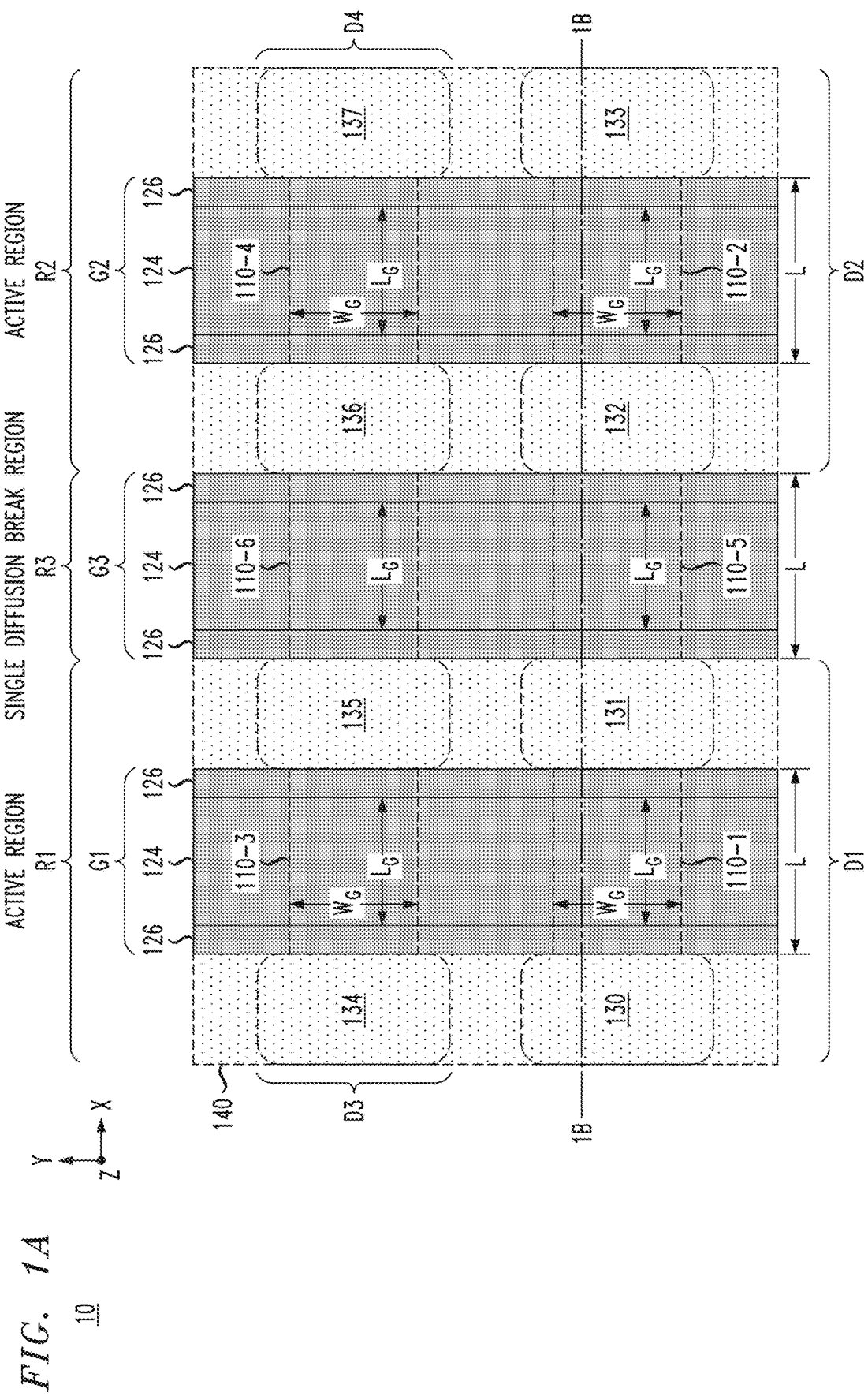

Embodiments of the invention will now be described in further detail with regard to methods for fabricating semiconductor integrated circuit devices having single diffusion break isolation structures for isolating gate-all-around FET devices such as nanosheet FET devices and nanowire FET devices. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

FIGS. 1A through 7 schematically illustrate a method for fabricating a semiconductor integrated circuit (IC) device having single diffusion break isolation structures for isolating nanosheet FET devices, according to an exemplary embodiment of the invention. To begin, FIGS. 1A and 1B schematically illustrate a semiconductor IC device 10 at an initial stage of fabrication comprising a plurality of nanosheet FET devices D1, D2, D3, and D4 formed on a semiconductor substrate 100. FIG. 1A is a schematic top plan view (X-Y plane) of the semiconductor IC device 10 and FIG. 1B is a schematic cross-sectional side view (X-Z plane) of the semiconductor IC device 10 along line 1B-1B in FIG. 1A. As shown in FIGS. 1A and 1B, the semiconductor IC device 10 comprises a first active region R1 and a second active region R2, which are separated by a single diffusion break region R3. The nanosheet devices D1 and D3 are disposed in the first active region R1 and the nanosheet devices D2 and D4 are disposed in the second active region R2.

The nanosheet device D1 comprises a nanosheet stack structure 110-1 and source/drain layers 130 and 131. The nanosheet device D2 comprises a nanosheet stack structure 110-2 and source/drain layers 132 and 133. The nanosheet device D3 comprises a nanosheet stack structure 110-3 and source/drain layers 134 and 135. The nanosheet device D4 comprises a nanosheet stack structure 110-4 and source/drain layers 136 and 137. The single diffusion break region R3 comprises a nanosheet stack structure 110-5 disposed between the source/drain layers 131 and 132, and a nanosheet stack structure 110-6 disposed between the source/drain layers 135 and 136. The nanosheet stack structures 110-1~110-6 each comprise a plurality of epitaxial semiconductor layers 111, 112, 113, 114, 115, 116, and 117, which include sacrificial nanosheet layers 111, 113, 115, and 117, and active nanosheet channel layers 112, 114, and 116, wherein each active nanosheet channel layer 112, 114, and 116 is disposed between sacrificial nanosheet layers. It is to be understood that the term "source/drain layer" as used herein means that a given source/drain layer can be either a source or drain of a nanosheet FET device, depending on the application or circuit configuration.

The semiconductor IC device 10 further comprises a plurality of gate structures G1, G2 and G3. The gate structure G1 is disposed in the first active region R1 and overlaps the nanosheet stack structures 110-1 and 110-3 of the respective nanosheet FET devices D1 and D3. The gate structure G2 is disposed in the second active region R2 and overlaps the nanosheet stack structures 110-2 and 110-4 of the respective nanosheet FET devices D2 and D3. The gate structure G3 is disposed in the single diffusion break region R3 and overlaps the nanosheet stack structures 110-5 and 110-6. At the stage of fabrication shown in FIGS. 1A and 1B, the gate structures G1, G2, and G3 comprise dummy gate structures, wherein each gate structure G1, G2 and G3 comprises a dummy gate oxide layer 120, a dummy gate electrode layer 122 (e.g., sacrificial polysilicon or amorphous silicon material), a gate capping layer 124, a gate sidewall spacer 126, and embedded sidewall spacers 128. The gate structures G1, G2, and G3 and the source/drain layers 130-133 are encapsulated in a layer of insulating material 140 (e.g., an interlevel dielectric (ILD) layer).

As explained in further detail below, the dummy gate oxide layers 120 and the dummy gate electrode layers 122 of the gate structures G1 and G2 comprise sacrificial gate material which is subsequently removed as part of a replacement metal gate (RMG) process and replaced with a high-k gate dielectric material and metallic material to form a common high-k dielectric/metal gate (HKMG) structure for the nanosheet FET devices D1 and D3 in the first active region R1, and a common HKMG structure for the nanosheet FET devices D2 and D4 in the second device region R2. Furthermore, as explained in further detail below, a single diffusion break process is performed to remove the dummy gate oxide layers 120 and the dummy gate electrode layers 122 of the gate structure G3 as well as remove and/or oxidize or otherwise replace the nanosheet stack structures 110-5 and 110-6 with insulating material in the diffusion break region R3 to thereby isolate the source/drain layers 131 and 132 of the adjacent nanosheet devices D1 and D2 in the different active regions R1 and R2, as well as isolate the source/drain layers 135 and 136 of the adjacent nanosheet devices D3 and D4 in the different active regions R1 and R2.

Figure 1B:
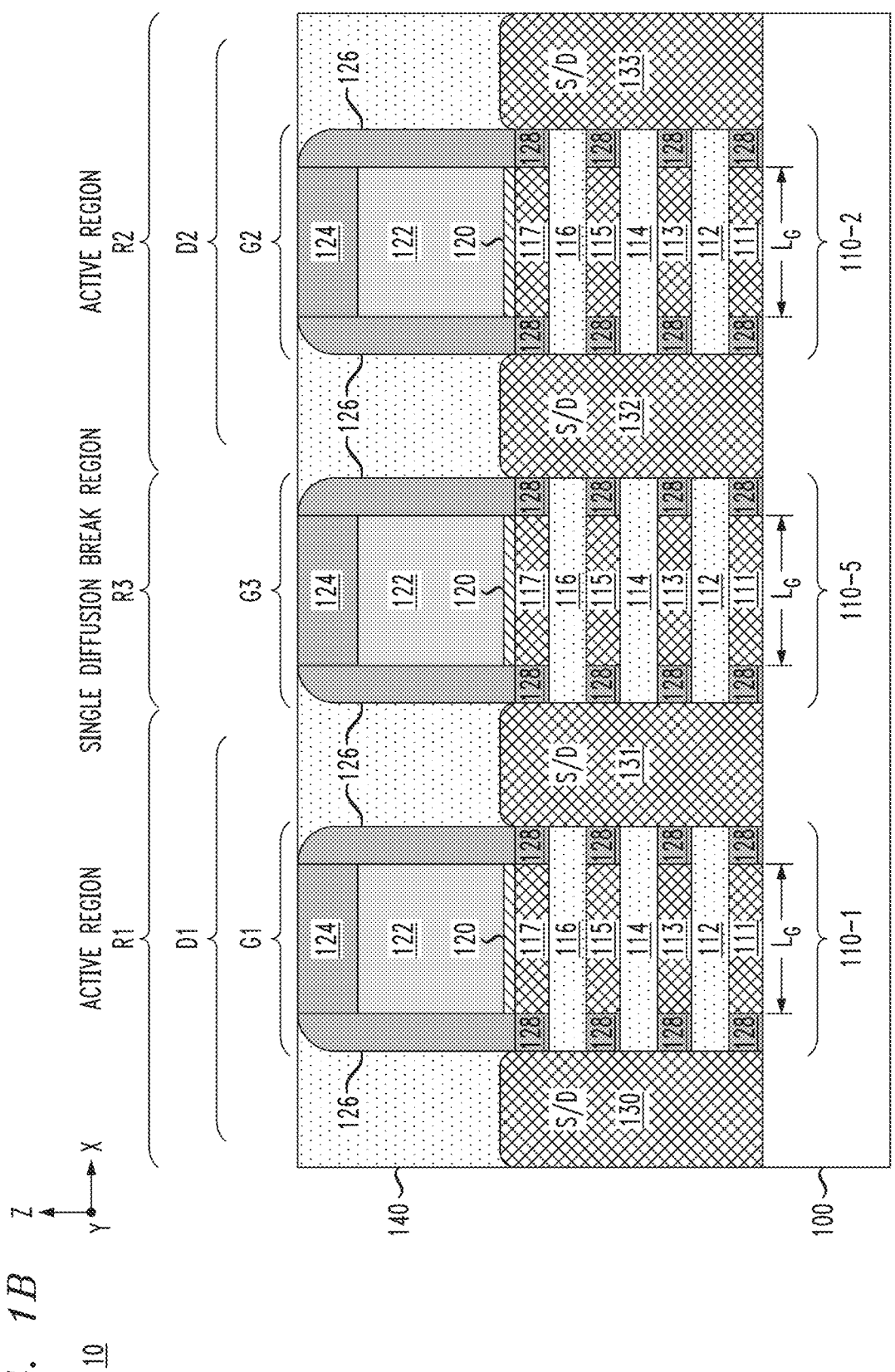
FIG. 1B is a schematic cross-sectional side view of the semiconductor IC device along line 1B-1B in FIG. 1A.

The intermediate structure of the semiconductor IC device 10 shown in FIGS. 1A and 1B is formed using known fabrication methods. While the semiconductor substrate 100 is illustrated as a generic substrate layer for ease of illustration, it is to be understood that the semiconductor substrate 100 may comprise one of different types of semiconductor substrate structures and materials. For example, in one embodiment, the semiconductor substrate 100 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In other embodiments, the semiconductor substrate 100 may be an SOI (silicon-on-insulator) substrate, a GeOI (germanium-on-insulator) substrate, or other types of semiconductor-on-insulator substrates, which comprise an insulating layer (e.g., oxide layer) disposed between a base substrate layer (e.g., silicon substrate) and an active semiconductor layer (e.g., Si, Ge, etc.) on which active circuit components are formed as part of a front-end-of-line (FEOL) structure. It is to be noted that in each drawing, the X-Y plane represents a plane that is parallel to the plane of the semiconductor substrate 100 (e.g., wafer) being processed.

The nanosheet stack structures 110-1~110-6 are fabricated by a process which comprises sequentially growing a stack of epitaxial semiconductor layers 111, 112, 113, 114, 115, 116, and 117 over the surface of the semiconductor substrate 100, and then patterning the stack of epitaxial semiconductor layers 111, 112, 113, 114, 115, 116, and 117 (or nanosheet layer stack 111-117) to form the individual nanosheet stack structures 110-1~110-6. In one embodiment, the epitaxial semiconductor layers 111-117 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The type of materials that are utilized to form the epitaxial semiconductor layers 111-117 will depend on the application.

For example, in one embodiment, the active nanosheet channel layers 112, 114, and 116 are formed of epitaxial silicon (Si). When the active nanosheet channel layers 112, 114, and 116 are formed of crystalline Si, the sacrificial nanosheet layers 111, 113, 115, and 117 (which serve as sacrificial layers that are subsequently etched away to release the active nanosheet channel layers 112, 114, and 116), can be formed of an epitaxial silicon-germanium (SiGe) alloy. This allows the epitaxial SiGe material of the sacrificial nanosheet layers 111, 113, 115, and 117 to be etched selective to the epitaxial Si material of the semiconductor channel layers 112, 114, and 116 in a subsequent process step to "release" the active nanosheet channel layers 112, 114, and 116. In other embodiments, the active nanosheet channel layers 112, 114, and 116 can be formed of an epitaxial SiGe material with a desired Ge concentration (optimized for device performance), and the sacrificial nanosheet layers 111, 113, 115, and 117 can be formed of a sacrificial semiconductor material (e.g., Si) that can be etched selective to the active nanosheet channel layers 112, 114, and 116. While the nanosheet stack structures 110-1~110-6 are shown to include three active nanosheet channel layers 112, 114, and 116, in other embodiments, the nanosheet stack structures 110-1~110-6 can be fabricated with more or less than three active nanosheet channel layers.

In one embodiment, the nanosheet stack structures 110-1~110-6 are patterned using a first etch process that is performed to define a gate width $G_W$ of elongated nanosheet stack structures (intermediate nanosheet stack structures) which traverse the different regions R1, R2 and R3, and a second etch process that is subsequently performed to define an overall length L of the nanosheet stack structures 110-1~110-6, as illustrated in FIG. 1A. The first etch process is performed by forming an etch mask (e.g., a lithographic mask) over the initial nanosheet layer stack 111-117, and then transferring an image of the etch mask into the nanosheet layer stack 111-117 using dry etch process (e.g., reactive ion etching (RIE)). The etch mask can be formed using any suitable patterning process including, but not limited to, a photolithography process, or a multi-patterning process such as a sidewall image transfer (SIT) process, a self-aligned double patterning (SADP) process, a self-aligned quadruple pattering (SAQP), etc. The etching can be performed using one or more sequential dry etch processes with etch chemistries that are suitable to etch the materials of semiconductor layers 111-117.

Although not shown in the Figures, an isolation layer (e.g., shallow trench isolation (STI) layer) can be formed following the initial etch process that is performed to pattern the nanosheet layer stack 111-117. For example, as part of the initial etch process, the exposed portion of the upper surface of the semiconductor substrate 100 can be recessed to a target depth to form trenches in the semiconductor substrate 100 which surround the intermediate elongated nanosheet stack structures (with defined gate widths $G_W$). The trenches are then filled with an insulating material to form STI layers. In one embodiment, the STI layers are formed by a process which comprises depositing a layer of insulating material over the surface of the semiconductor structure to cover the partially formed nanosheet stack structures, planarizing the surface of the semiconductor structure (via chemical mechanical polishing (CMP)) down to an upper surface of the partially formed nanosheet stack structures to remove the overburden insulating material, and then performing an etch-back (or recess) process to recess the remaining layer of insulating material down to a target level which defines a thickness of the STI layer. The STI layers can be formed of any type of insulating material, such a silicon oxide material, which is suitable for the given fabrication process flow.

Following the initial etch process to pattern the nanosheet layer stack 111-117, the dummy gate structures G1, G2 and G3 are formed. The dummy gate structure are formed using known methods. For example, a thin conformal layer of silicon oxide is first deposited over the entire surface of the semiconductor IC device, followed by a blanket deposition of a layer of polysilicon (or alternatively, amorphous silicon) over the conformal layer of silicon oxide, and planarization of the polysilicon layer. A hard mask layer is formed on the planarized surface of the polysilicon layer by depositing a layer of dielectric material or multiple layers of dielectric materials (e.g., SiN, SiOCN, SiBCN). The hard mask layer is then patterned to form the gate capping layers 124, which define an image of the gate structures G1, G2 and G3. The gate capping layers 124 are utilized as an etch hardmask to anisotropically etch (e.g., RIE) the sacrificial polysilicon and oxide layers to thereby form the dummy gate layers 120 and 122.

The gate sidewall spacers 126 are then formed by depositing a conformal layer of dielectric material over the entire surface of the semiconductor IC device 10. The conformal layer of dielectric material can be formed of SiN, SiBCN, SiCON, or any other type of low-k dielectric material that is commonly used to form insulating gate sidewall spacers of FET devices, and deposited using known techniques such as ALD, CVD and PVD. The conformal layer of dielectric material is then patterned by performing an anisotropic dry etch process, such as RIE, to etch down the conformal layer of dielectric material in a vertical direction. This etch process is performed selective to the semiconductor materials of the intermediate nanosheet stack structures. The etch process results in the formation of the gate sidewall spacers 126, which surrounds the dummy gate layers 120 and 122 and the gate capping layers 124, as shown in FIGS. 1A and 1B.

After forming the gate sidewall spacers 126, an anisotropic dry etch process (e.g., RIE) is performed to etch the exposed portions of the intermediate nanosheet stack structures in source/drain regions adjacent to the gate structures G1, G2, and G2 down to the substrate 100 and/or isolation layer. The etch process results in defining the overall length L (in the X-direction) of the individual nanosheet stack structures 110-1~110-6. The gate widths $W_G$ (in the Y-direction) of the nanosheet stack structures 110-1~110-6 are maintained since the sidewall surfaces of the nanosheet stack structures 110-1~110-6 which define the gate width $W_G$ are covered by the dummy gate layers 120 and 122, and the gate sidewall spacers 126.

A next stage of the fabrication process comprises forming the embedded gate sidewall spacers 128 within sidewalls of the nanosheet stack structures 110-1~110-6 using known methods. For example, in one exemplary process flow, the process begins by laterally recessing (in the X-direction) exposed sidewall surfaces of the sacrificial nanosheet layers 111, 113, 115, and 117 of the nanosheet stack structures 110-1~110-6 to form recesses in the sidewalls of the nanosheet stack structures 110-1~110-6. The depth of the lateral recess is controlled through a timed etch. In one embodiment, the exposed sidewall surfaces of the sacrificial nanosheet layers 111, 113, 115, and 117 are recessed to a depth which is equal to a lateral thickness of the gate sidewall spacers 126. The lateral etch process can be performed using an isotropic wet etch process with an etch solution that is suitable to etch the semiconductor material (e.g., SiGe) of the sacrificial nanosheet layers 111, 113, 115, and 117 of the nanosheet stack structures 110-1~110-6 selective to the semiconductor material (e.g., Si) of the active nanosheet channel layers 112, 114, and 116, and other exposed elements.

The embedded gate sidewall spacers 128 are then formed by depositing a conformal layer of dielectric material over the semiconductor IC device until the recesses in the sidewalls of the nanosheet stack structures 110-1~110-6 are filled with dielectric material, followed by an etch back to remove the excess dielectric material from the gate structure and the substrate 100. The dielectric material is deposited using a highly conformal deposition process, such as ALD, to ensure that the recesses are sufficiently filled with dielectric material. The embedded gate sidewall spacers 128 can be formed of the same dielectric material used to form the gate sidewall spacer 126. For example, the embedded gate sidewall spacers 128 can be formed of SiN, SiBCN, SiCO, SiBCN, SiCON, or any other suitable type of dielectric material (e.g., a low-k dielectric material having a k of less than 5, wherein k is the relative dielectric constant). The conformal layer of dielectric material can be etched back using an isotropic (wet or dry) etch process to remove the excess dielectric material, while leaving the dielectric material in the recesses to form the embedded gate sidewall spacers 128. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HFEG), hydrochloric acid (HCl), or any combination thereof.

Following formation of the embedded gate sidewall spacers 128, the process flow continues with formation of the source/drain layers 130-137 of the nanosheet FET device D1, D2, D3, and D4. The source/drain layers 130-137 are formed by epitaxially growing semiconductor material (e.g., epitaxial Si material, SiGe material, carbon-doped silicon (Si:C) material) on the exposed sidewall surfaces of the active nanosheet channel layers 112, 114, and 116 using known techniques such as CVD, MOCVD, LPCVD, MBE, VPE, or other known epitaxial growth techniques which are suitable for the given process flow. The exposed sidewall surfaces of the active nanosheet channel layers 112, 114, and 116 of the nanosheet stack structures 110-1~110-6 provide surface areas to seed the epitaxial growth of the source/drain layers 130-137. The type of epitaxial semiconductor material that is used to form the source/drain layers 130-137 will vary depending on, e.g., the device type (e.g., N-type or P-type) of the nanosheet FET devices, etc. The source/drain layers N-type nanosheet FET devices and P-type nanosheet FET devices are formed using separate epitaxial deposition processes.

In some embodiments, as shown in FIGS. 1A and 1B, the epitaxial growth of the source/drain layers 130-137 on the ends of the active nanosheet channel layers 112, 114 and 116 is performed so that the epitaxial material merges (in the X and Z-directions) to form merged source/drain layers 130-137 between the nanosheet stack structures 110-1~110-6. Furthermore, in some embodiments, the source/drain layers 130-137 are doped using known techniques. For example, in one embodiment, the source/drain layers 130-137 are "in-situ" doped during epitaxial growth by adding a dopant gas to the source deposition gas (i.e., the Si-containing gas). Exemplary dopant gases may include a boron (B) containing gas such as $BH_3$ for P-type FETs or a phosphorus (P) or arsenic (As) containing gas such as $PH_3$ or $AsH_3$ for n-type FETs, wherein the concentration of impurity in the gas phase determines its concentration in the epitaxially grown semiconductor material.

The use of an in-situ doping process is merely an example. For instance, an ex-situ process may be used to introduce dopants into the source/drain layers. Other doping techniques can be used to incorporate dopants in the source/drain layers. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

In addition, in some embodiments, a thermal anneal process is performed following the epitaxial growth and doping of the source/drain layers 130-137 to cause dopants to be injected into the end portions of the active nanosheet channel layers 112, 114, and 116 that are in contact with the epitaxial semiconductor material of the source/drain layers 30-137. This anneal process effectively results in extending the source/drain layers into the semiconductor material of the end portions of the active nanosheet channel layers 112, 114, and 116, which results in a decrease in the parasitic resistance of the nanosheet FET devices D1, D2, D3 and D4. In other embodiments, the thermal anneal process is performed in later process (such as after the formation of the high-k gate dielectric layers) so that the same anneal process can serve two purposes at the same time: driving dopants into the active nanosheet channel layers, and improve the reliability of the high-k gate dielectric.

Following the formation of the epitaxial source/drain layers 130-137, the process flow continues with forming the insulating layer 140 (e.g., ILD layer, or PMD layer) to encapsulate the gate structures G1, G2, G3 and the source/drain layers 130-137 in dielectric/insulating material. In one embodiment, the insulating layer 140 is formed by depositing a blanket layer of dielectric/insulating material over the semiconductor IC device and planarizing the layer of dielectric/insulating material down to the gate capping layer 124 to form the insulating layer 140, as shown schematically shown in FIGS. 1A and 1B.

The insulating layer 140 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material of the insulating layer 140 is deposited using known deposition techniques, such as, for example, ALD, CVD, PECVD, PVD, or spin-on deposition. In one embodiment, the layer of dielectric/insulating material is planarized using a standard planarization process such as CMP to remove the overburden dielectric/insulating down to the upper surface of the dummy gate capping layers 124. In some embodiments, the insulating layer 140 comprises a conformal silicon nitride liner that is initially formed on the exposed surfaces of dummy gate structure and source/drain layers 130-137 before blanket depositing one or more insulating materials to form the insulating layer 140.

Figure 2:
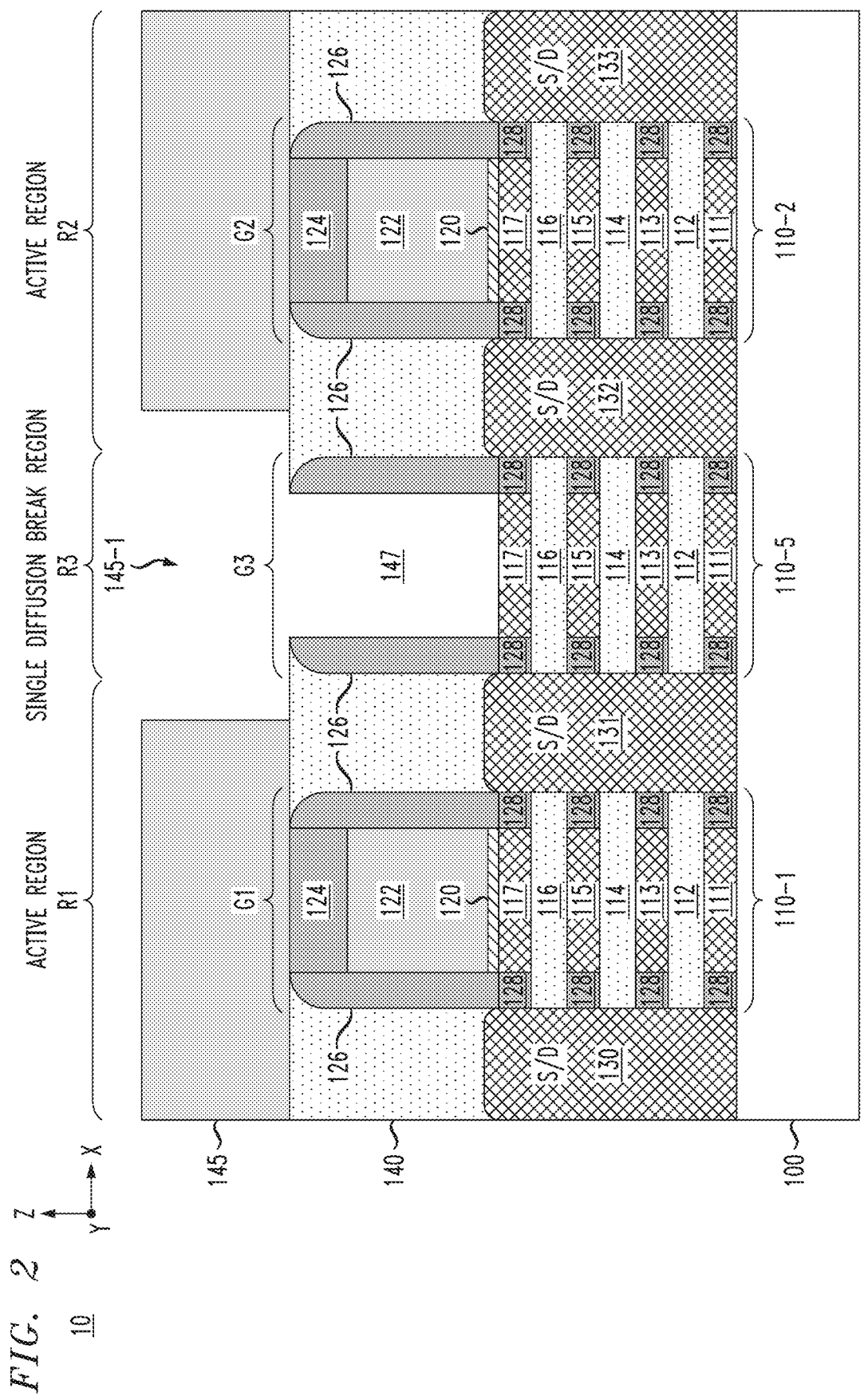

A next phase of the fabrication process comprises forming a single diffusion break isolation structure in the single diffusion break region R3 to isolate the nanosheet FET devices of the first and second active regions R1 and R2, using a process flow as schematically illustrated in FIGS. 2-5. In particular, FIG. 2 is a schematic cross-sectional side view of the intermediate device structure shown in FIGS. 1A and 1B after forming an etch mask 145 which comprises an opening 145-1 to expose the gate structure G3 in the single diffusion break region R3 and after removing the dummy gate layers of the gate structure G3 to expose the nanosheet stack structures 110-5 and 110-6 in the single diffusion break region R3. In one embodiment, the etch mask 145 comprises an organic planarizing layer (OPL) or any other type of material which is self-leveling and achieves planarization over the surface topography without the use of etching, chemical mechanical polishing, or other conventional planarization techniques. The etch mask 145 is lithographically patterned using a lithographic stack comprising, e.g., an antireflection coating (ARC) layer and a photoresist mask.

In some embodiments, the exposed dummy gate capping layer 124 of the gate structure G3 is removed by etching away the dielectric material (e.g., SiN) of the gate capping layer 124 selective to the materials of the gate sidewall spacer 126 (e.g., SiBCN) and the insulating layer 140 (e.g., silicon oxide) to expose the underlying dummy gate electrode layer 122. The dummy gate electrode layer 122 (e.g., sacrificial polysilicon layer, or amorphous silicon layer) and dummy gate oxide layer 120 are then etched away using known etching techniques and etch chemistries to form an open gate region 147. For example, the sacrificial dummy gate polysilicon material can be removed using a selective dry etch or wet etch process with suitable etch chemistries, including ammonium hydroxide ($NH_4OH$), tetramethylammonium hydroxide (TMAH), or $SF_6$ plasma. After the polysilicon material is removed, an oxide etch process is performed to etch away the dummy gate oxide layer 120.

Figure 3:
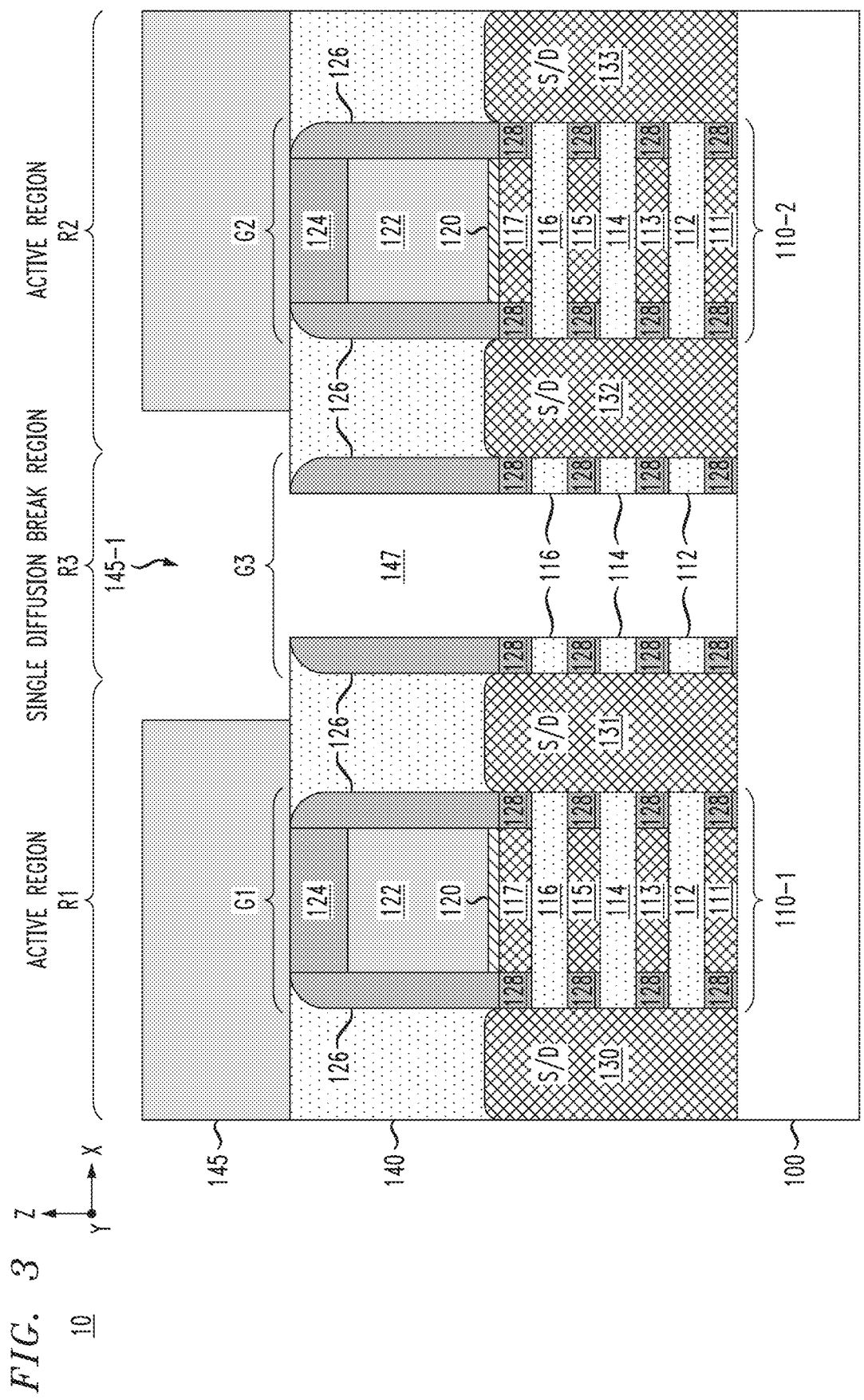

Next, FIG. 3 is a schematic cross-sectional side view of the intermediate device structure shown in FIG. 2 after performing an anisotropic etch process to vertically etch the exposed nanosheet stack structures 110-5 and 110-6 in the single diffusion break region R3 down to the surface of the underlying substrate 100 or isolation layer (not shown). In one embodiment, the anisotropic etch process is performed using a RIE process with an etch chemistry that is configured to etch the epitaxial semiconductor materials (e.g., Si and SiGe) that form the various nanosheet layers 111-117. As shown in FIG. 3, at the completion of the anisotropic etch process, the open gate region 147 extends down to the upper surface of the substrate 100 and end portions of the nanosheet channel layers 112, 114 and 116 remain disposed between the embedded sidewall spacers 128.

Figure 4:
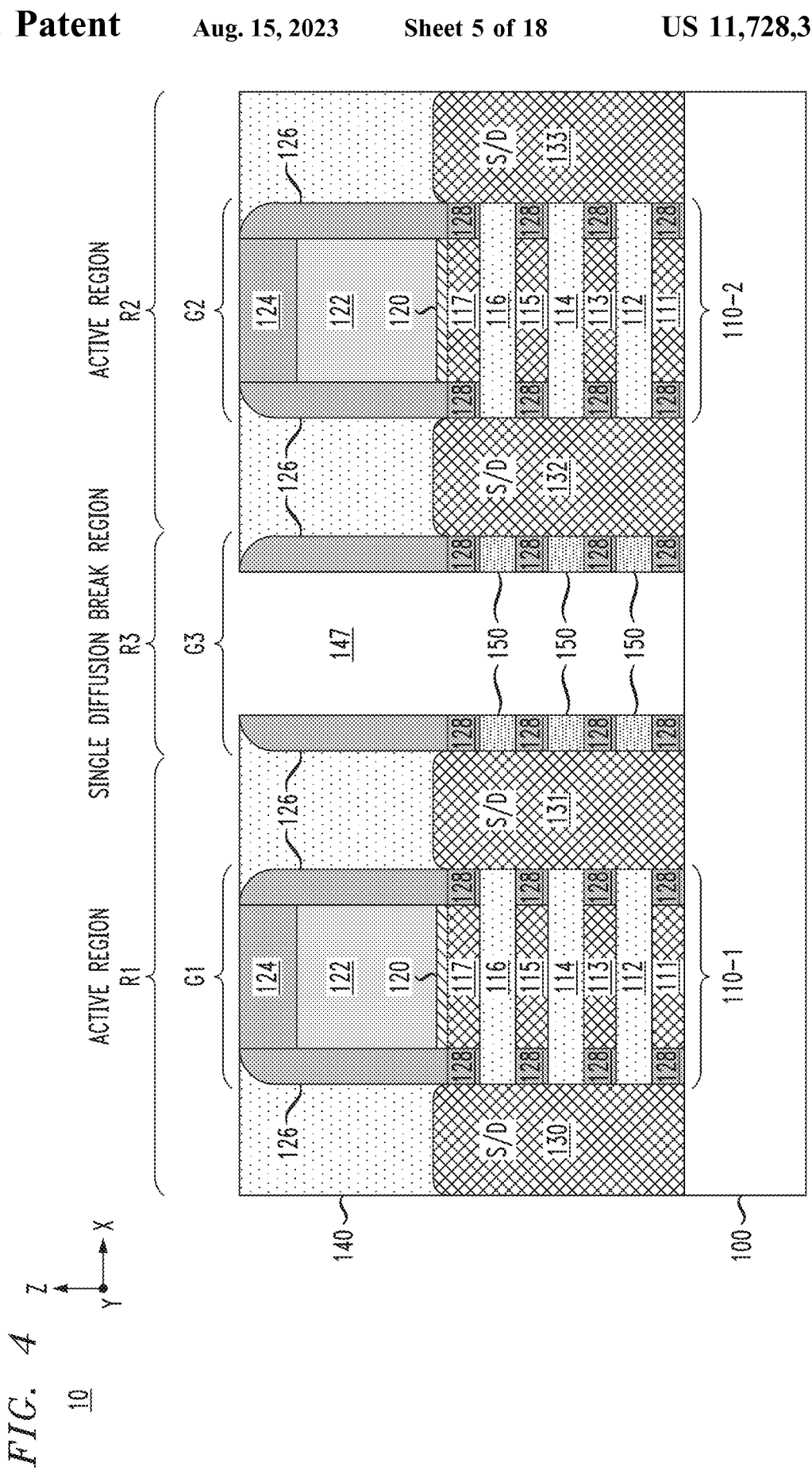

Next, FIG. 4 is a schematic cross-sectional side view of the intermediate device structure shown in FIG. 3 after removing the etch mask 145 and performing an oxidation process to oxidize the remaining end portions of the nanosheet channel layers 112, 114, and 116 and thereby form embedded oxide layers 150. The etch mask 145 is removed using known methods (e.g., ashing). The oxidation process is performed using any suitable isotropic oxidation process, such as plasma oxidation, to oxidize the end portions of the nanosheet channel layers 112, 114, 116 between the embedded sidewall spacers 128. In some embodiments, when the nanosheet channel layers 112, 114 and 116 comprise epitaxial Si material, the oxide layers 150 comprise silicon oxide layers that are formed by oxidation of the epitaxial Si material. The oxide layers 150 essentially comprise second embedded gate sidewall spacers that are disposed between the first gate sidewall spacers 128.

Figure 5:
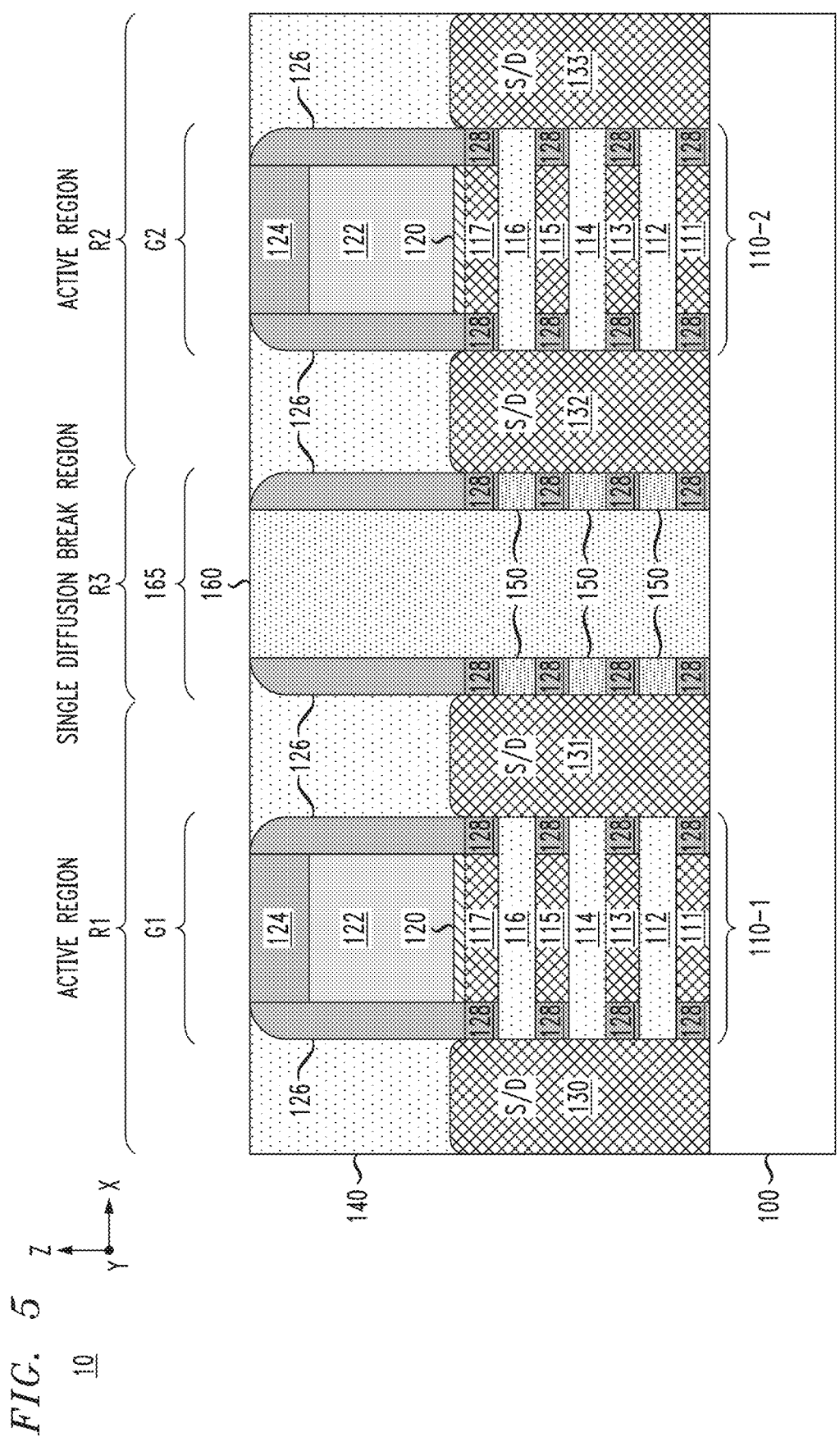

Next, FIG. 5 is a schematic cross-sectional side view of the intermediate device structure shown in FIG. 4 after filling the open gate region 147 with insulating material 160 to thereby complete formation of a single diffusion break isolation structure 165. In some embodiments, the insulating material 160 comprises the same or similar material that forms the insulating layer 140. For example, in one embodiment, the insulating material 160 comprises silicon oxide. The open gate region 147 is filled by depositing a layer of insulating material (e.g. silicon oxide) until the open gate region 147 is filled, and then performing a CMP process to remove the overburden insulating material and planarize the surface of the semiconductor IC device down to the gate capping layers 124 of the gate structures G1 an G2, resulting in the intermediate structure shown in FIG. 5. In the exemplary embodiment of FIG. 5, the single diffusion break isolation structure 165, which is collectively comprised of the gate sidewall spacer 126, the embedded sidewall spacers 128, the oxide layers 150, and the insulating layer 160, serves to isolate the nanosheet FET devices D1 and D3 in the first active region R1 from the nanosheet FET devices D2 and D4 in the second active region R2.

Figure 6:
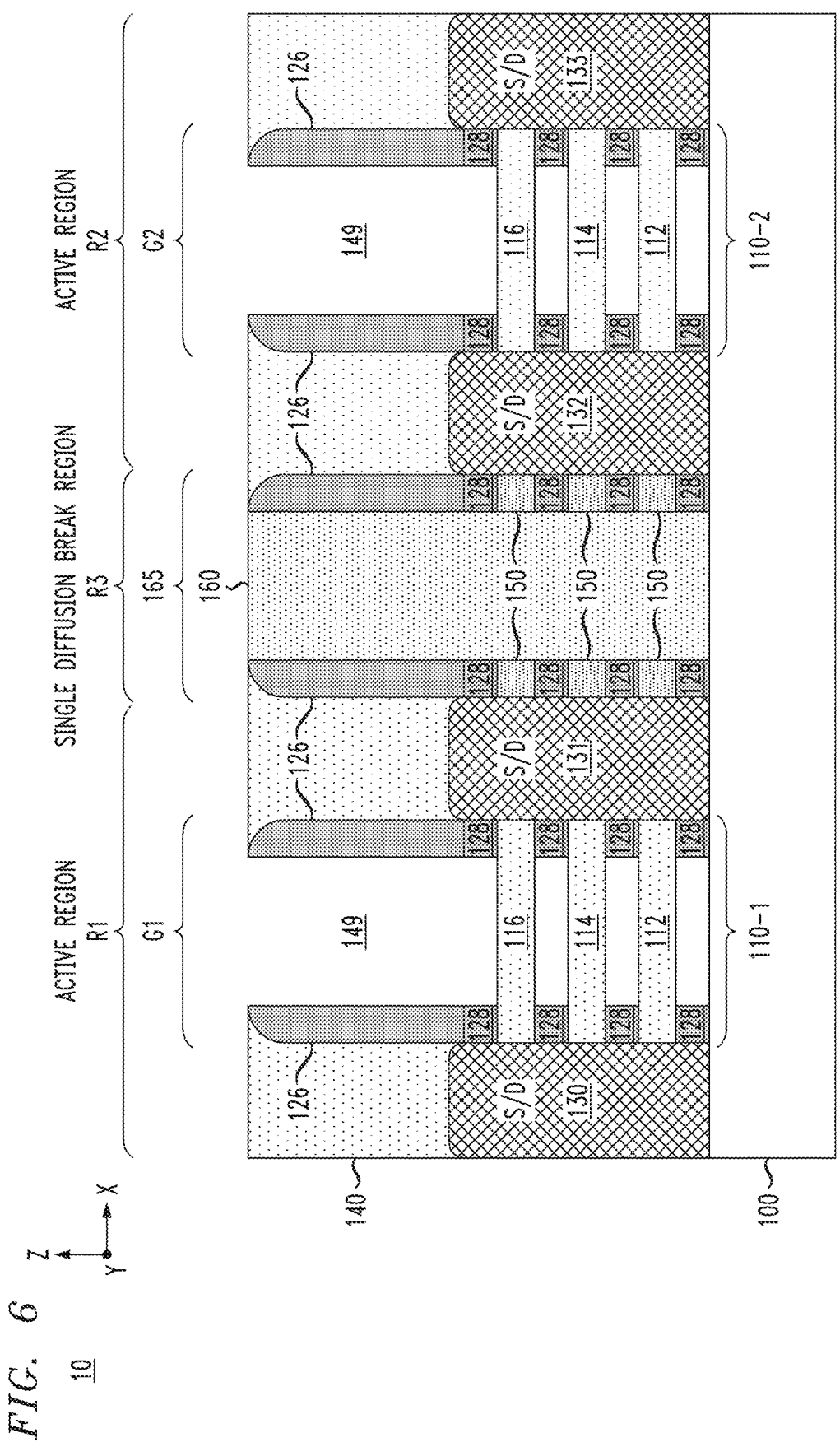
Figure 7:
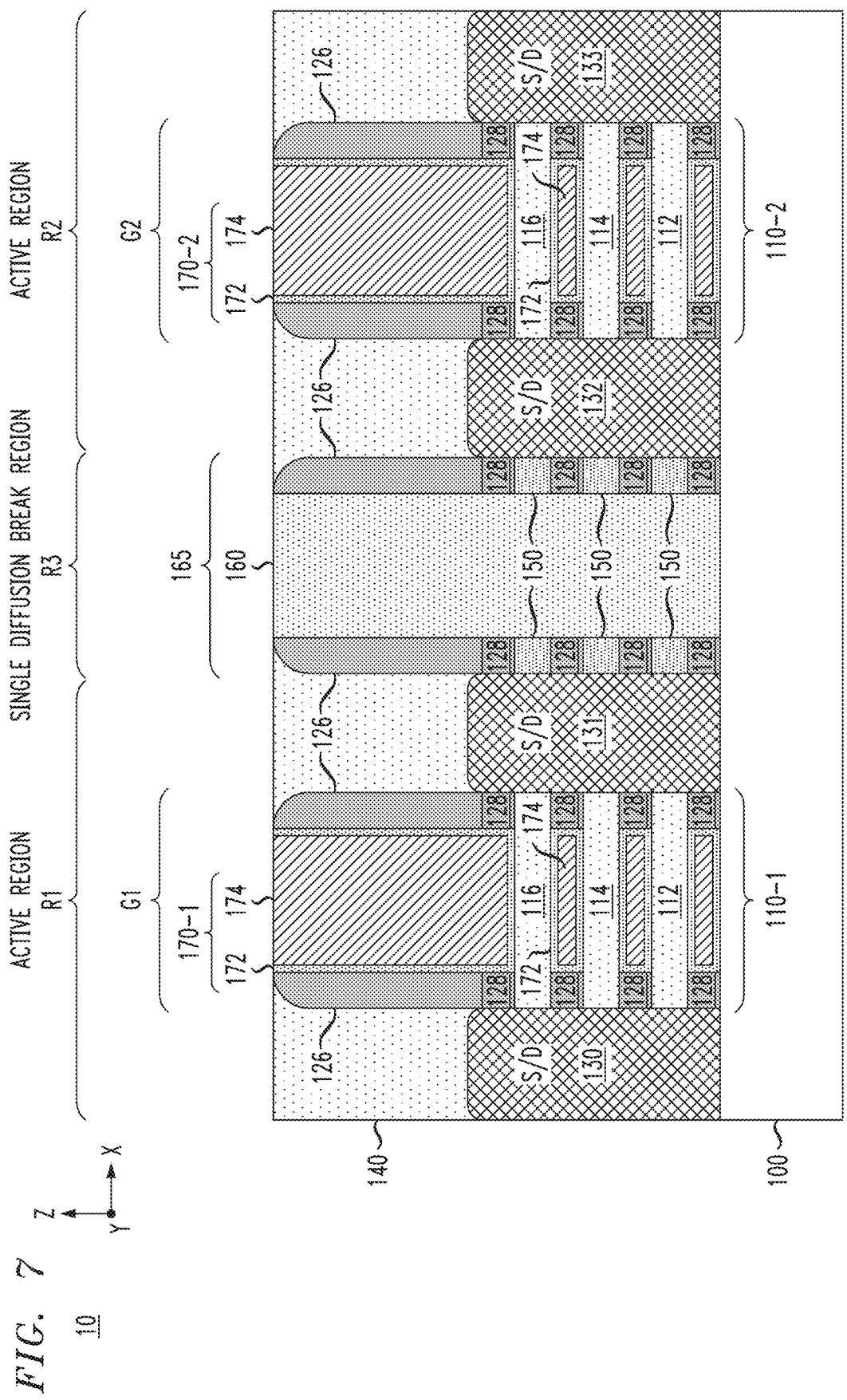

Following the formation of the single diffusion break isolation structure 165, a replacement metal gate process is performed to replace the sacrificial gate dummy gate materials of the gate structures G1 and G2 with a HKMG structure, using a process flow as schematically illustrated in FIGS. 6 and 7. For example, FIG. 6 is a schematic cross-sectional view of the intermediate device structure shown in FIG. 5 after removing the dummy gate capping layer 124 and the dummy gate sacrificial layers (e.g., the dummy gate oxide layer 120 and the dummy gate electrode layer 122) of the gate structures G1 and G2, and after removing the sacrificial nanosheet layers 111, 113, 115, and 117 to release the active nanosheet channel layers 112, 114 and 116 of the nanosheet stack structures 110-1, 110-2, 110-3, and 110-4 and form open gate regions 149. The gate capping layers 124 and dummy gate layers 122 and 120 are removed using techniques as discussed above. The dummy oxide layers 120 are removed using an oxide etch process that is highly selective to, e.g., the active nanosheet channel layers 112, 114, and 116. In this manner, the sacrificial materials (e.g., dummy polysilicon and oxide layers) of the dummy gate can be etched away without damaging the active nanosheet channel layers 112, 114, and 116 of the nanosheet stack structures 110-1, 110-2, 110-3, and 110-4.

After removing the dummy gate layers 122 and 120, an etch process is performed to selectively etch away the sacrificial nanosheet layers 111, 113, 115, and 117 of the nanosheet stack structures 110-1, 110-2, 110-3, and 110-4 and thereby release the active nanosheet channel layers 112, 114, and 116 and extend the open gate regions 149 into spaces between and adjacent to the active nanosheet channel layers 112, 114, and 116. The sacrificial nanosheet layers 111, 113, 115, and 117 (e.g., SiGe layers) are etched selective to the active nanosheet channel layers 112, 114, and 116 (e.g., Si layers). In one embodiment, the SiGe material of the sacrificial nanosheet layers 111, 113, 115, and 117 can be selectively etched (with high etch selectivity) using a gas phase HCl (hydrochloric acid) or wet etch solution containing hydrogen peroxide ($H_2O_2$) to etch the SiGe material of the sacrificial nanosheet layers 111, 113, 115, and 117 selective to the Si material of the active nanosheet channel layers 112, 114, and 116. The gas phase HCl (hydrochloric acid) provides high etch selectivity when, for example, the active nanosheet channel layers 112, 114, and 116 are formed of Si or SiGe with a lower Ge concentration than the SiGe material of the sacrificial nanosheet layers 111, 113, 115, and 117.

Next, FIG. 7 is a schematic cross-sectional side view of the intermediate device structure shown in FIG. 6 after forming HKMG structures 170-1 and 170-2 for the gate structures G1 and G2, respectively. The HKMG structure 170-1 comprises a common metal gate structure for the nanosheet FET devices D1 and D3 in the first active region R1, and the HKMG structure 170-2 comprises a common metal gate structure for the nanosheet FET devices D2 and D4 in the second active region R2. The HKMG structures 170-1 and 170-2 each comprise high-k gate dielectric layers 172 that are formed on exposed surfaces of the active nanosheet channel layers 112, 114 and 116, and a metal gate layer 174 formed over the high-k gate dielectric layers 172.

In one embodiment, the HKMG structures 170-1 and 170-2 are formed by depositing one or more conformal layers of high-k gate dielectric material over the exposed surfaces of the semiconductor structure to conformally cover the surfaces of the active nanosheet channel layers 112, 114, and 116. The high-k gate dielectric layers 172 are preferably formed of high-k dielectric material having a dielectric constant of about 3.9 or greater. For example, the gate dielectric material can include but is not limited to metal oxides such as hafnium oxide, hafnium silicon oxide, hafnium silicon oxynitride, hafnium zirconium oxide, and nitride films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal high-k gate dielectric layers 172 are formed with a thickness in a range of about 0.5 nm to about 2.0 nm, which will vary depending on the target application. The conformal layer of high-k gate dielectric material is deposited using known methods such as ALD, for example, which allows for high conformality of the gate dielectric material.

As is known in the art, the use of high-k gate dielectric materials can be problematic in that such dielectric materials typically do not interface well with silicon layers. For example, high-k gate dielectric materials do not passivate a silicon surface, which results in a large number of interface traps and charges and other issues which can degrade device performance. As such, in one exemplary embodiment, before depositing the high-k dielectric material to form the high-k gate dielectric layers 172, a channel pre-clean process is performed to clean the exposed silicon surfaces of the active nanosheet channel layers 112, 114, and 116, which is then followed by an oxidation process to form ultra-thin interfacial silicon oxide layers on the exposed surfaces of the active nanosheet channel layers 112, 114, and 116. In one exemplary embodiment, the interfacial silicon oxide layers are formed using a chemical oxidation process with an ozonated deionized water comprising ozone, and a suitable oxidation temperature, ozone concentration in the deionized water, and chemical oxidation process time to form thin interfacial silicon oxide layers. The interfacial layers are formed by oxidizing the exposed silicon surfaces of the active nanosheet channel layers 112, 114, and 116 to form thin interfacial silicon oxide layers with a thickness in a range of about 5 angstroms to about 10 angstroms (i.e., about 0.5 nm to about 1 nm). It is to be understood that the formation of the interfacial silicon oxide layers is an optional step and that in other embodiments of the invention, the high-k dielectric material of the HKMG structures 170-1 and 170-2 can be formed on the exposed silicon surfaces of the active nanosheet channel layers 112, 114, and 116 without initially forming the thin interfacial oxide layers.

In some embodiments, the metal gate layers 174 comprises one or more work function metal layers which are conformally deposited over the high-k gate dielectric layer 172. The work function metal layer(s) may comprise one or more types of metallic materials, including, but not limited to, titanium nitride (TiN), tantalum nitride (TaN), and an Al-containing alloy (e.g., TiAlC, TiAl, and AlC, or nitrided alloys thereof). In other embodiments, the work function metal layer(s) may comprise a metallic material which comprises a composition or alloy of Zr, W, Hf, Ti, Al, Ru, Pa, ZrAl, WAl, TaAl, HfAl, TaC, TiC, TaMgC, and other types, compositions, or alloys of work function metals that are commonly used to obtain target work functions for the nanosheet FET devices. The work function metal layers are conformally deposited using known methods such as ALD, CVD, etc., which allow for high conformality of the deposited work function metal layers.

In some embodiments, the work function metal layers completely fill the spaces above and below the active nanosheet channel layers 112, 114, and 116. Indeed, in instances where the initial spacing between the active nanosheet channels 112, 114 and 116 is relatively small (e.g., 7 nm to 10 nm), after formation of the high-k dielectric layer 172, the conformal deposition of a stack of two or more work function metal layers can result in filling (i.e., pinch-off) the spaces above and below the active nanosheet channel layers 112, 114, and 116 such that the spaces are filled with gate dielectric material and work function metal. This is sufficient for short-channel length nanosheet FET devices where $L_G$ is about 15 nm or less.

Furthermore, in some embodiments, the remaining portions of the open gate regions 149 above the active nanosheet channel layers 116 can be filled with work function metal by continuing the deposition process for the last deposited work function metal layer until the open gate regions 149 above the active nanosheet channel layers 116 are completely filled with the work function metal layer. In other embodiments, the remaining portion of the open gate regions 149 can be filled with a low-resistance metallic material such as tungsten, ruthenium, cobalt, copper, aluminum, etc., to form a metallic gate electrode apart from the work function metal.

Following the deposition of the dielectric and metallic materials that form the HKMG structures 170-1 and 170-2, a CMP process is performed to polish the surface of the semiconductor device structure down to the ILD layer 140, thereby removing overburden portions of the gate dielectric, work function, and gate electrode layers, resulting in the semiconductor structure shown in FIG. 7. Following formation of the HKMG structures 170-1 and 170-2, any known sequence of processing steps can be performed to complete the fabrication of the semiconductor integrated circuit device, the details of which are not needed to understand embodiments of the invention.

Briefly, following the formation of the HKMG structures 170-1 and 170-2, an etch process can be performed to recess an upper surface of the HKMG structures 170-1 and 170-2 down to a target level below the upper surface of the insulating layer 140. A layer of dielectric material is then deposited over the surface of the semiconductor device structure to fill the area above the recessed surfaces of the HKMG structures 170-1 and 170-2 with dielectric material, and the semiconductor device structure is planarized down to the surface of the insulating layer 140 to remove the overburden dielectric material, and thereby form gate capping layers. The gate capping layers can be formed of a dielectric material such as SiN or SiBCN, etc. Next, middle-of-the-line (MOL) processing can continue to form MOL contacts such as vertical source/drain contacts and gate contacts, etc., using known materials and fabrication techniques. Then, a back-end-of-line (BEOL) process module can be performed to fabricate a BEOL interconnect structure which provides connections to/between the MOL contacts, and other active or passive devices that are formed as part of the front-end-of-line (FEOL) layer.

Figure 8:
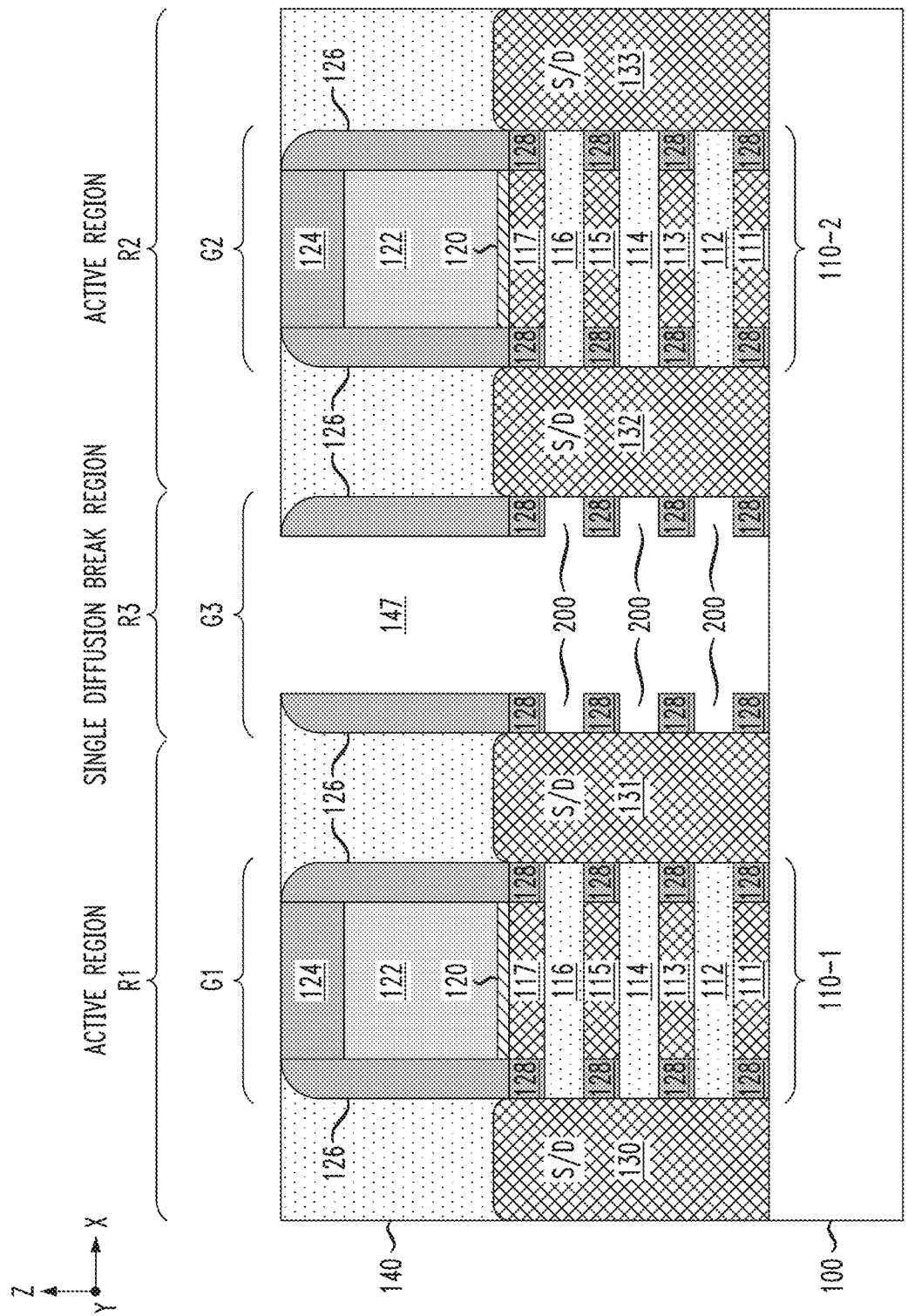
Figure 9:
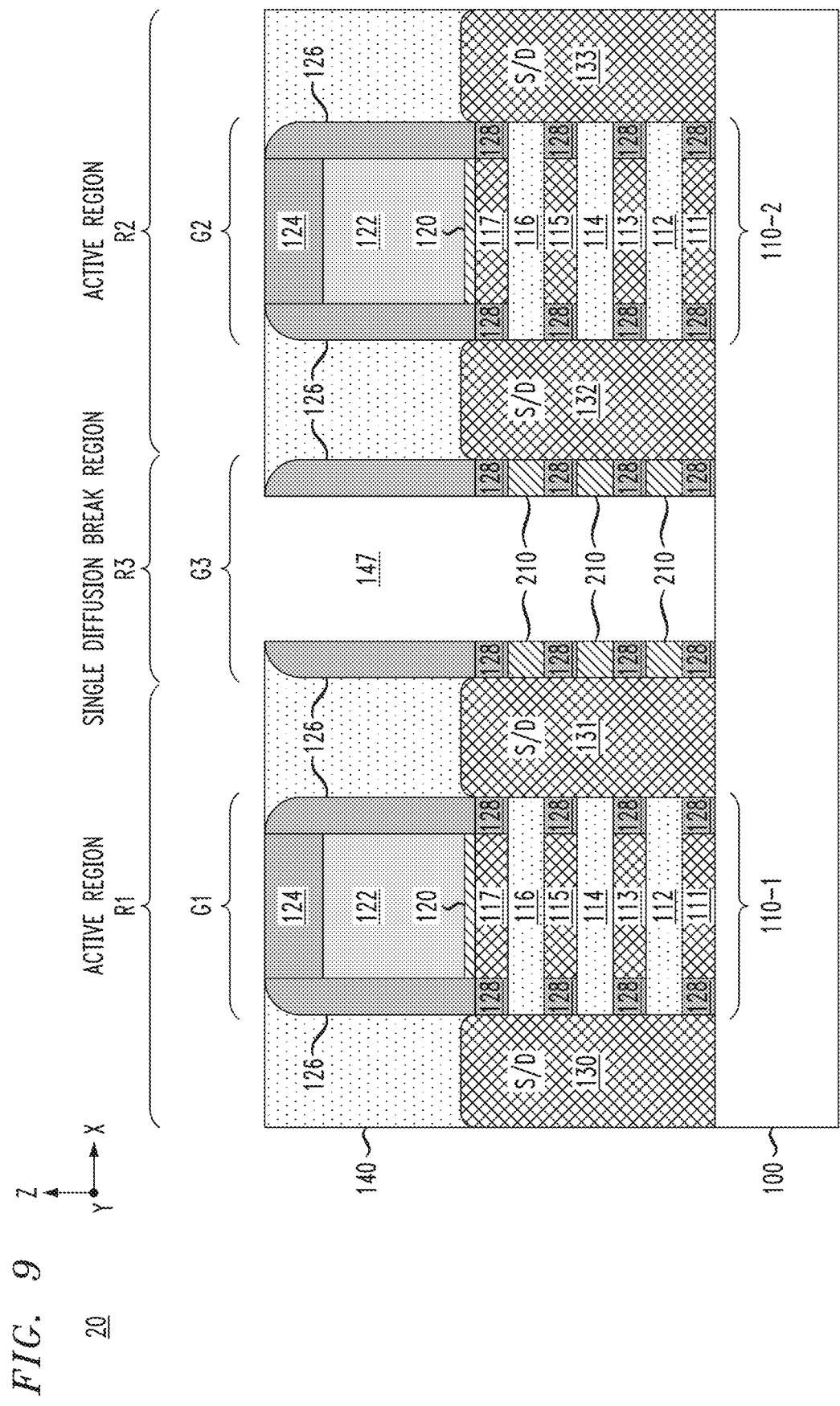
Figure 10:
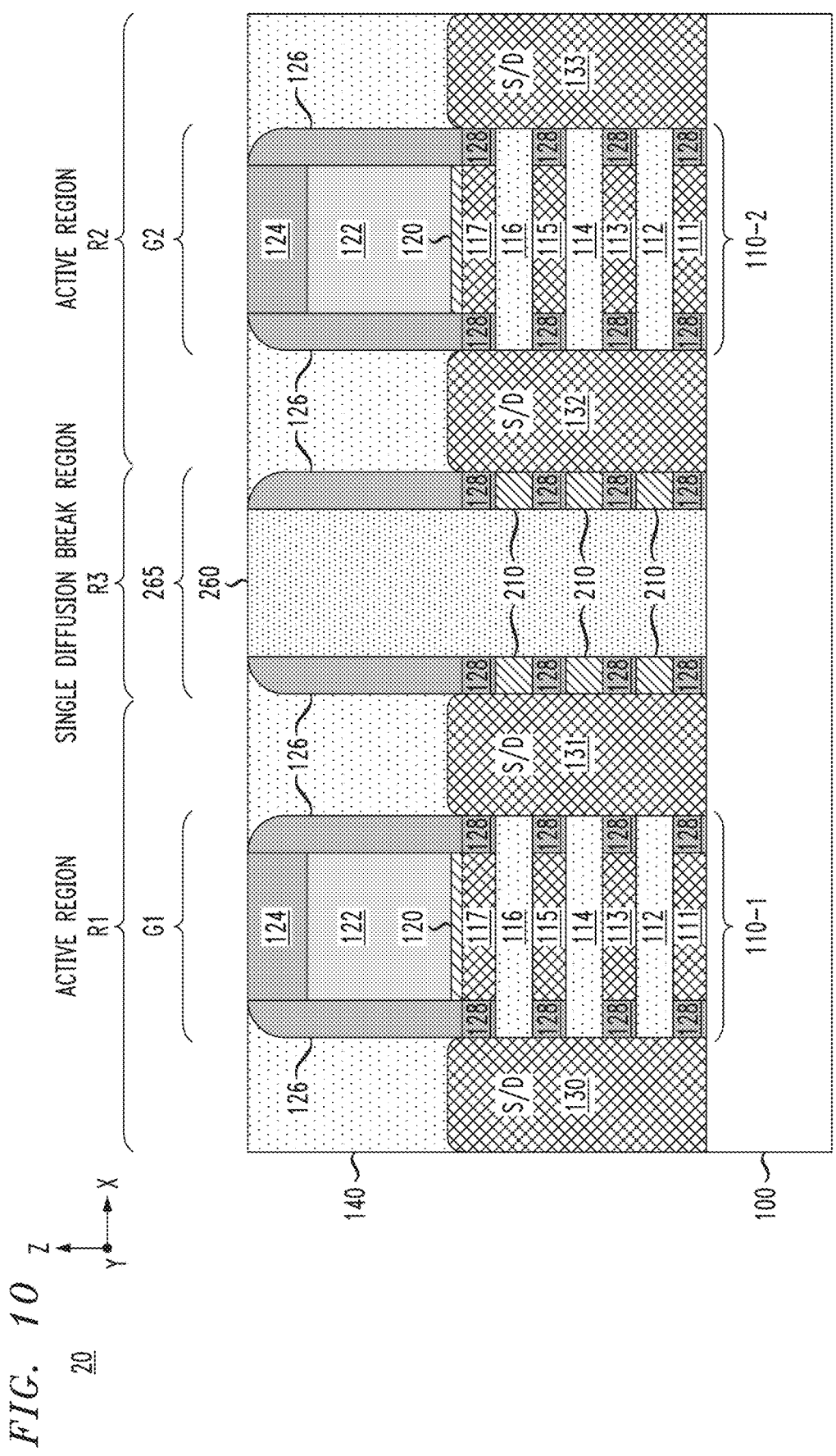

FIGS. 8 through 10 schematically illustrate a method for fabricating a semiconductor IC device 20 having single diffusion break isolation structures for isolating nanosheet FET devices, according to another exemplary embodiment of the invention. In particular, FIGS. 8-10 schematically illustrate a process for fabricating an alternative embodiment of a single diffusion break isolation structure in the single diffusion break region R3 to isolate the nanosheet FET devices of the first and second active regions R1 and R2. The method of FIGS. 8-10 begins with the process flow and intermediate structures as discussed above in conjunction with FIGS. 1A, 1B, 2 and 3, the details of which will not be repeated. FIG. 8 is a schematic cross-sectional side view of the intermediate device structure shown in FIG. 3 after removing the etch mask 145 and after removing the remaining end portions of the nanosheet channel layers 112, 114, and 116 to thereby form recess regions 200 between the embedded sidewall spacers 128. The etch mask 145 is removed using known methods (e.g., ashing). The end portions of the nanosheet channel layers 112, 114, 116 disposed between the embedded sidewall spacers 128 are removed using any suitable horizontal conformal recess etch process. The recess process is performed using a timed etch to prevent gouging of the source/drain layers 131 and 132 and other source/drain layers disposed adjacent to the single diffusion break region R3.

Next, FIG. 9 is a schematic cross-sectional side view of the intermediate device structure shown in FIG. 8 after filling the recess regions 200 with dielectric material to form second embedded sidewall spacers 210 between the first embedded sidewall spacers 128. The second embedded sidewall spacers 210 are formed by depositing a conformal layer of dielectric material until the recess regions 200 are filled with dielectric material (e.g., until pinch-off of the dielectric material occurs in the recess regions 200), followed by an etch back to remove the excess dielectric material from the sidewall and bottom surfaces of the open gate region 147. The dielectric material is deposited using a highly conformal deposition process, such as ALD, to ensure that the recess regions 200 are sufficiently filled with dielectric material. The second embedded sidewall spacers 210 can be formed of the same or similar dielectric material used to form the first embedded sidewall spacers 128 and/or the gate sidewall spacers 126. The conformal layer of dielectric material that is deposited to fill the recess regions 200 can be etched back using an isotropic (wet or dry) etch processes to remove the excess dielectric material, while leaving the dielectric material in the recess regions 200 to form the second embedded sidewall spacers 210 and avoiding over etching or gouging of the first embedded sidewall spacers 128. The wet etch process may include, but is not limited to, buffered hydrofluoric acid, diluted hydrofluoric acid, hydrofluoric nitric acid, phosphoric acid, HF diluted by ethylene glycol, hydrochloric acid, or any combination thereof.

Next, FIG. 10 is a schematic cross-sectional side view of the intermediate device structure shown in FIG. 9 after filling the open gate region 147 with insulating material 260 to thereby complete formation of a single diffusion break isolation structure 265. In some embodiments, the insulating material 260 comprises the same or similar material that forms the insulating layer 140. For example, in one embodiment, the insulating material 260 comprises silicon oxide. The open gate region 147 is filled by depositing a layer of insulating material (e.g. silicon oxide) until the open gate region 147 is filled, and then performing a CMP process to remove the overburden insulating material and planarize the surface of the semiconductor IC device down to the gate capping layers 124 of the gate structures G1 an G2, resulting in the intermediate structure shown in FIG. 10.

In the exemplary embodiment of FIG. 10, the single diffusion break isolation structure 265, which is collectively comprised of the gate sidewall spacer 126, the embedded sidewall spacers 128 and 210, and the insulating layer 260, serves to isolate the nanosheet FET devices D1 and D3 in the first active region R1 from the nanosheet FET devices D2 and D4 in the second active region R2. Following formation of the single diffusion break isolation structure 265, the fabrication process continues by performing a replacement metal gate process as discussed above in conjunction with FIGS. 6 and 7 to form HKMG structures of the gate structures G1 and G2.

Figure 11:
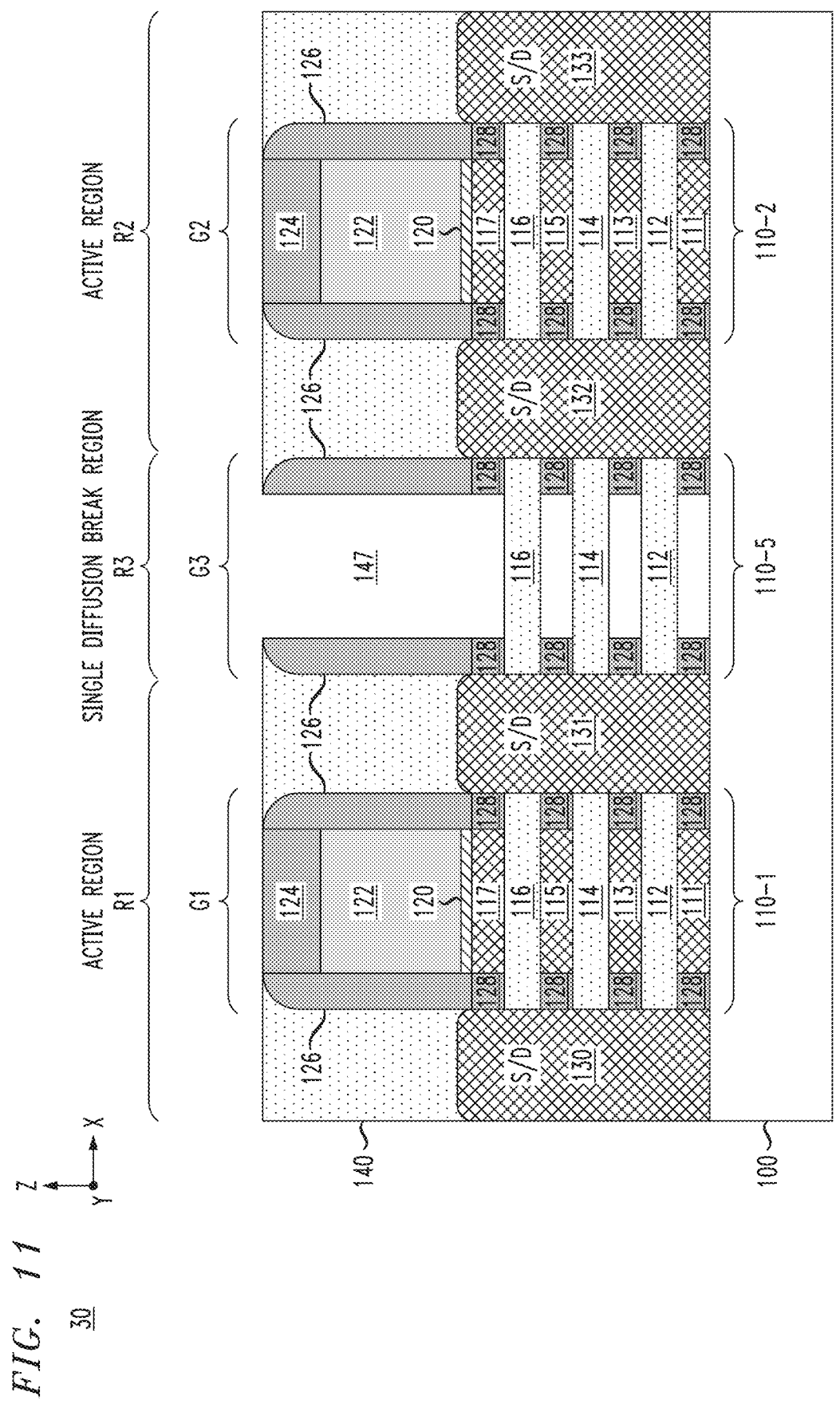
Figure 12:
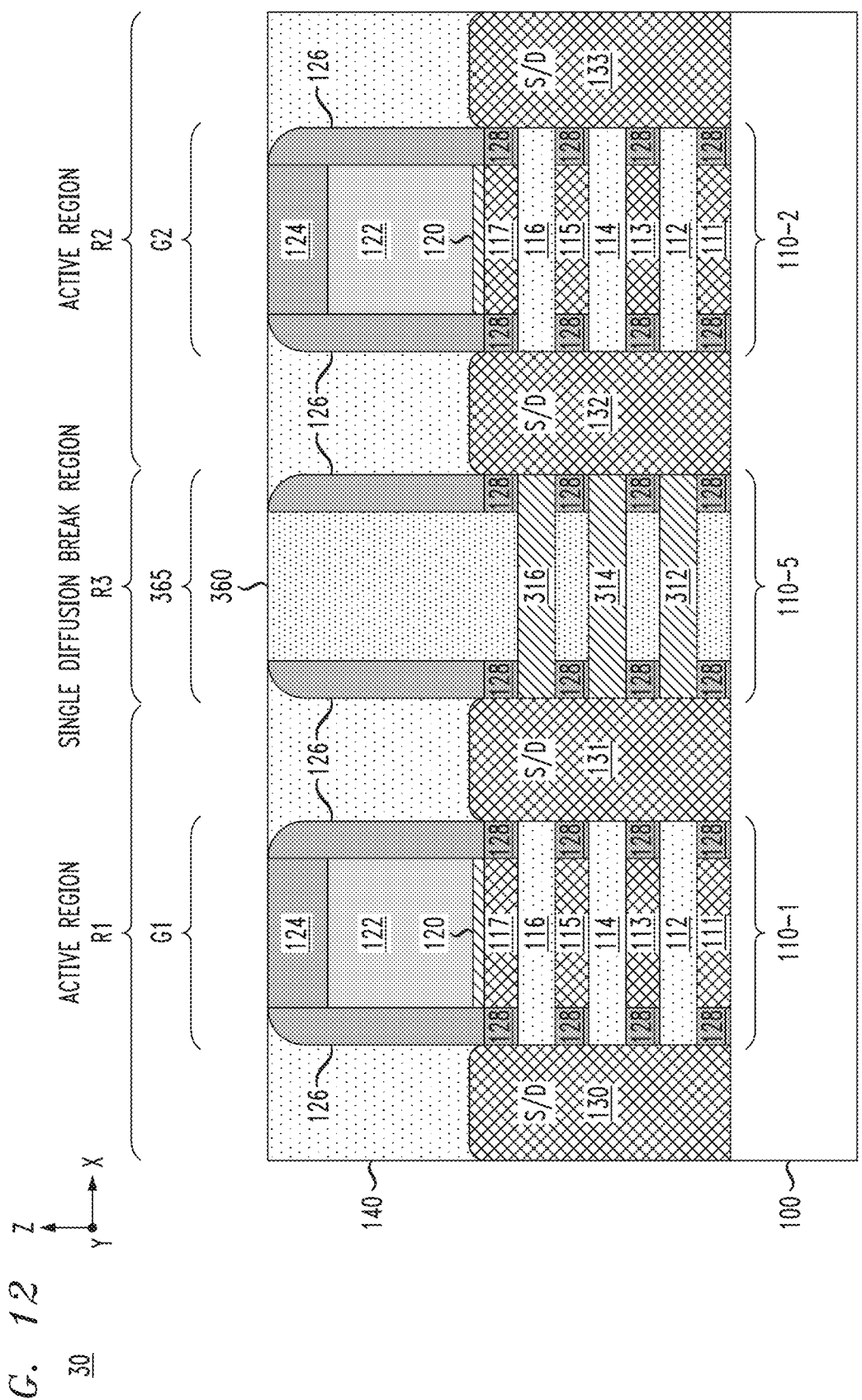

FIGS. 11 and 12 schematically illustrate a method for fabricating a semiconductor IC device 30 having single diffusion break isolation structures for isolating nanosheet FET devices, according to another exemplary embodiment of the invention. In particular, FIGS. 11 and 12 schematically illustrate a process for fabricating an alternative embodiment of a single diffusion break isolation structure in the single diffusion break region R3 to isolate the nanosheet FET devices of the first and second active regions R1 and R2. The method of FIGS. 11 and 12 begins with the process flow and intermediate structures as discussed above in conjunction with FIGS. 1A, 1B, and 2, the details of which will not be repeated. FIG. 11 is a schematic cross-sectional side view of the intermediate device structure shown in FIG. 2 after removing the etch mask 145 and after selectively etching away the sacrificial nanosheet layers 111, 113, 115, and 117 of the exposed nanosheet stack structures 110-5 and 110-6 in the single diffusion break region R3. The sacrificial nanosheet layers 111, 113, 115, and 117 are etched selective to the nanosheet channel layers 112, 114, and 116 (and other surrounding materials and structures) using the same or similar techniques as discussed above.

Next, FIG. 12 is a schematic cross-sectional side view of the intermediate device structure shown in FIG. 11 after oxidizing the nanosheet channel layers 112, 114, and 116 to form oxide layers 312, 314, and 316, and after filling the open gate region 147 with insulating material 360 to thereby complete formation of a single diffusion break isolation structure 365. The nanosheet channel layers 112, 114 and 116 are oxidized using known techniques which allow the epitaxial silicon material of the nanosheet channel layers 112, 114 and 116 to be converted to silicon oxide material. For example, the oxidation process can be performed using a plasma oxidation process or a chemical oxidation process using ozonated deionized water, etc. In some embodiments, the insulating material 360 comprises the same or similar material that forms the insulating layer 140. For example, in one embodiment, the insulating material 360 comprises silicon oxide. The open gate region 147 is filled by depositing a layer of insulating material (e.g. silicon oxide) until the open gate region 147 is filled, and then performing a CMP process to remove the overburden insulating material and planarize the surface of the semiconductor IC device down to the gate capping layers 124 of the gate structures G1 an G2, resulting in the intermediate structure shown in FIG. 12.

In the exemplary embodiment of FIG. 12, the single diffusion break isolation structure 365, which is collectively comprised of the gate sidewall spacer 126, the embedded sidewall spacers 128, the oxide layers 312, 314 and 316, and the insulating layer 360, serves to isolate the nanosheet FET devices D1 and D3 in the first active region R1 from the nanosheet FET devices D2 and D4 in the second active region R2. Following formation of the single diffusion break isolation structure 365, the fabrication process continues by performing a replacement metal gate process as discussed above in conjunction with FIGS. 6 and 7 to form HKMG structures of the gate structures G1 and G2.

Figure 13A:
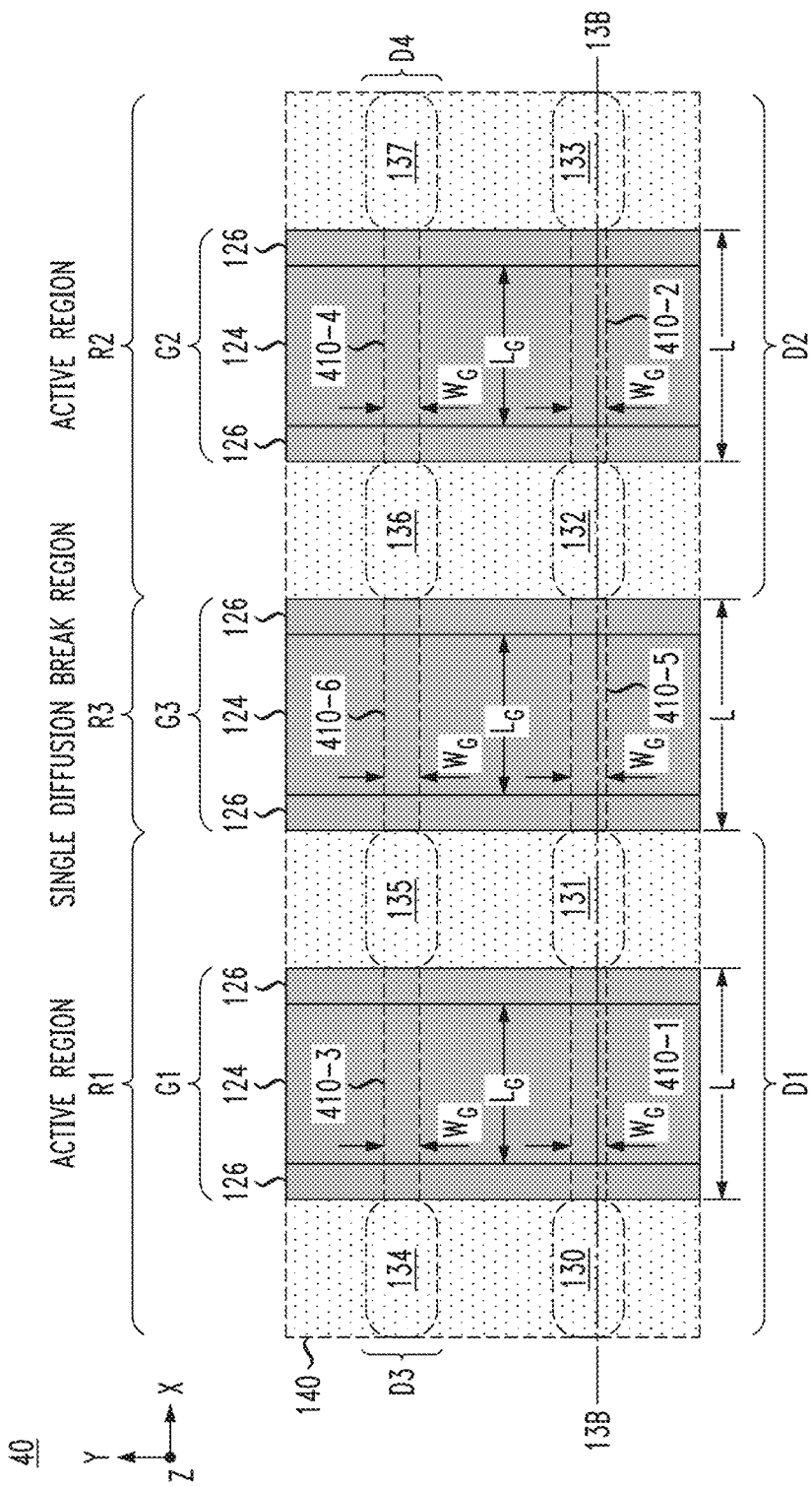

FIGS. 13A through 16 schematically illustrate a method for fabricating a semiconductor IC device having single diffusion break isolation structures for isolating nanowire FET devices, according to an exemplary embodiment of the invention. To begin, FIGS. 13A and 13B schematically illustrate a semiconductor IC device 40 at an initial stage of fabrication comprising a plurality of nanowire FET devices D1, D2, D3, and D4 formed on a semiconductor substrate 100. FIG. 13A is a schematic top plan view (X-Y plane) of the semiconductor IC device 40 and FIG. 13B is a schematic cross-sectional side view (X-Z plane) of the semiconductor IC device 40 along line 13B-13B in FIG. 13A. The semiconductor IC device 40 as shown in FIGS. 13A and 13B is similar in configuration to the semiconductor IC device 10 of FIGS. 1A and 1B, except that that nanowire FET devices D1, D2, D3 and D4 comprise nanowire stack structures with gate widths $W_G$ that are the same or smaller than the thickness of the spacers 126 (e.g., nanowire channel layers have a critical dimension (CD) that is similar or smaller than the CD of the spacers 126).

More specifically, nanowire device D1 comprises a nanowire stack structure 410-1 and source/drain layers 130 and 131. The nanowire device D2 comprises a nanowire stack structure 410-2 and source/drain layers 132 and 133. The nanowire device D3 comprises a nanowire stack structure 410-3 and source/drain layers 134 and 135. The nanowire device D4 comprises a nanowire stack structure 410-4 and source/drain layers 136 and 137. The single diffusion break region R3 comprises a nanowire stack structure 410-5 disposed between the source/drain layers 131 and 132, and a nanowire stack structure 410-6 disposed between the source/drain layers 135 and 136. The nanowire stack structures 410-1~410-6 each comprise a plurality of epitaxial semiconductor layers 411, 412, 413, 414, 415, 416, and 417, which include sacrificial nanowire layers 411, 413, 415, and 417, and active nanowire channel layers 412, 414, and 416, wherein the active nanowire channel layer 412, 414, and 416 is disposed between sacrificial layers 411, 413, 415, and 417. The intermediate structure of the semiconductor IC device 40 shown in FIGS. 13A and 13B is formed using known fabrication methods including, for example, the fabrication methods as discussed above for fabricating the semiconductor IC device 10 of FIGS. 1A and 1B, the details of which will not be repeated.

Figure 13B:
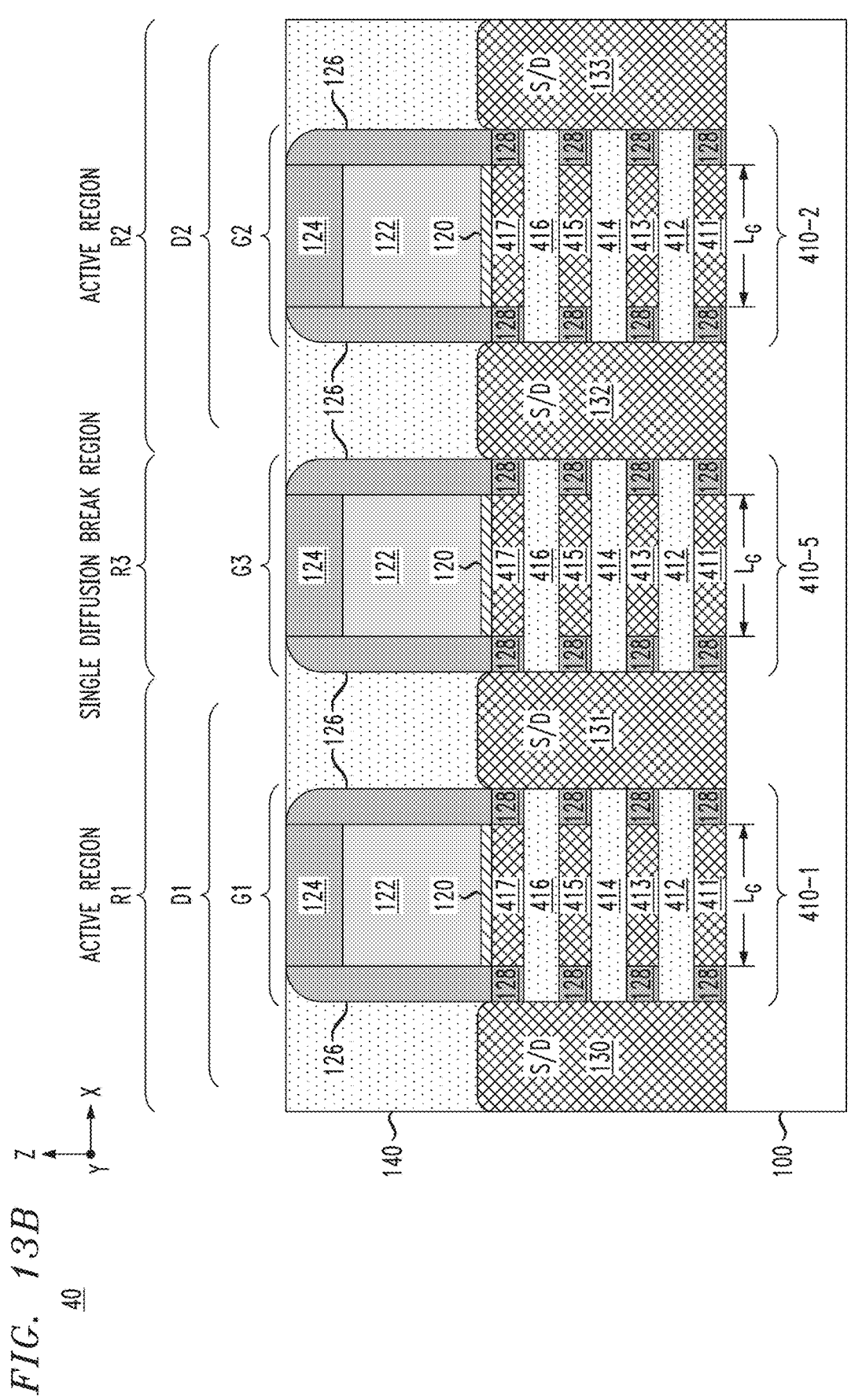
FIG. 13B is a schematic cross-sectional side view of the semiconductor IC device along line 13B-13B in FIG. 13A.
Figure 14:
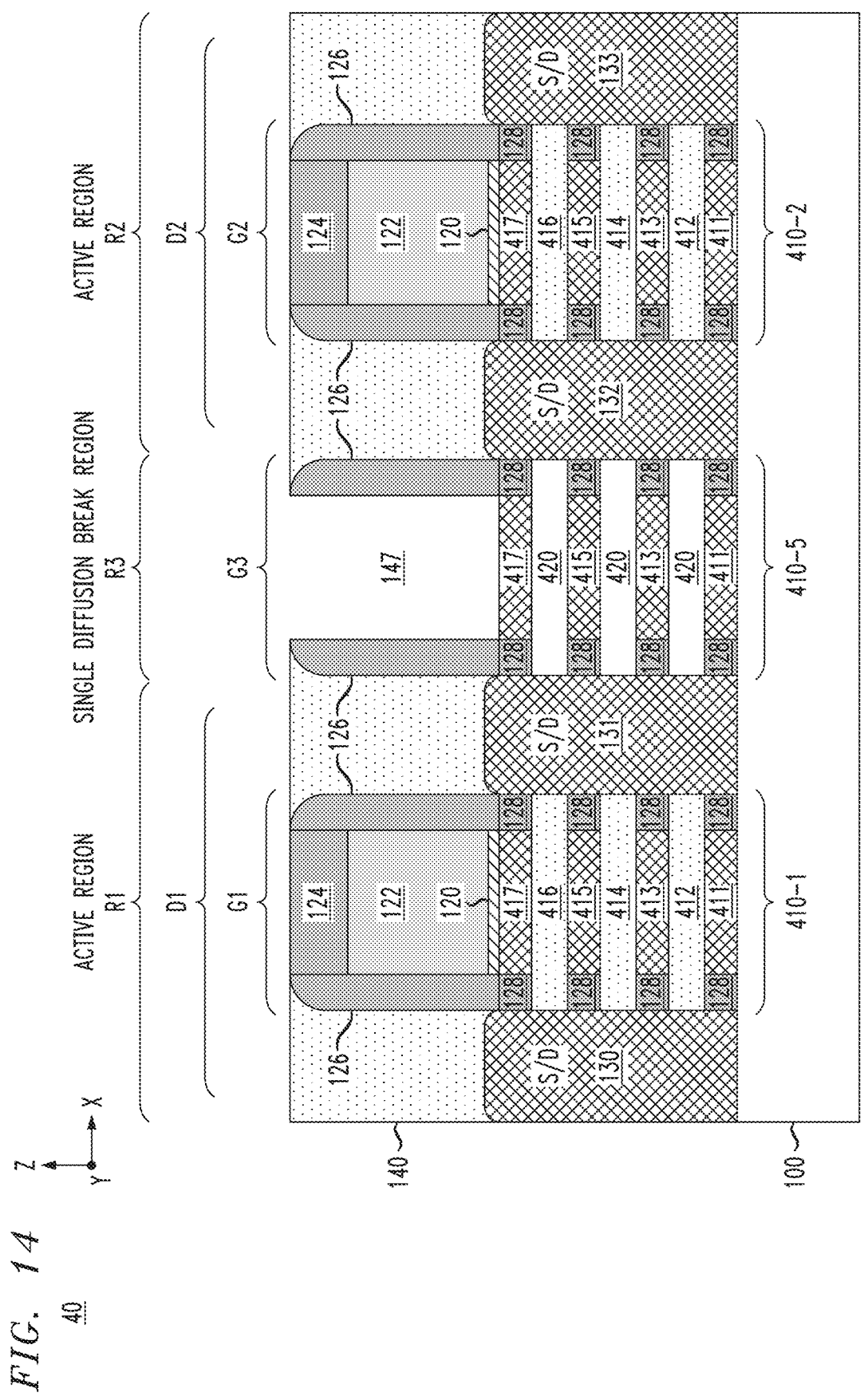

FIG. 14 is a schematic cross-sectional side view of the intermediate device structure shown in FIGS. 13A and 13B after removing the dummy gate layers of the gate structure G3 to form an open gate region 147 which exposes the nanowire stack structures 410-5 and 410-6 in the single diffusion break region R3, and after selectively etching away the nanowire channel layers 412, 414, and 416 of the exposed nanowire stack structures 410-5 and 410-6 in the single diffusion break region R3 to form spaces 420 between the sacrificial nanowire layers 411, 413, 415, and 417. The dummy gate capping layer 124 and dummy gate layers 120 and 122 of the gate structure G3 are removed using etching methods as discussed above. The nanowire channel layers 412, 414, and 416 (e.g., epitaxial Si layers) are etched selective to the sacrificial nanowire layers 411, 413, 415, and 417 (e.g., epitaxial SiGe layers) and other surrounding materials and structures using the same or similar techniques as discussed above. In this embodiment, the small width $W_G$ (or diameter) of the nanowire channel layers 412, 414, and 416 allows the nanowire channel layers 412, 414, and 416 to be isotropically etched and form the spaces 420 without gouging the areas of the source/drain layers (e.g., source drain layer 131 and 132, as shown in FIG. 14) that are in contact with the end portions of the nanowire channel layers 412, 414, and 416.

Figure 15:
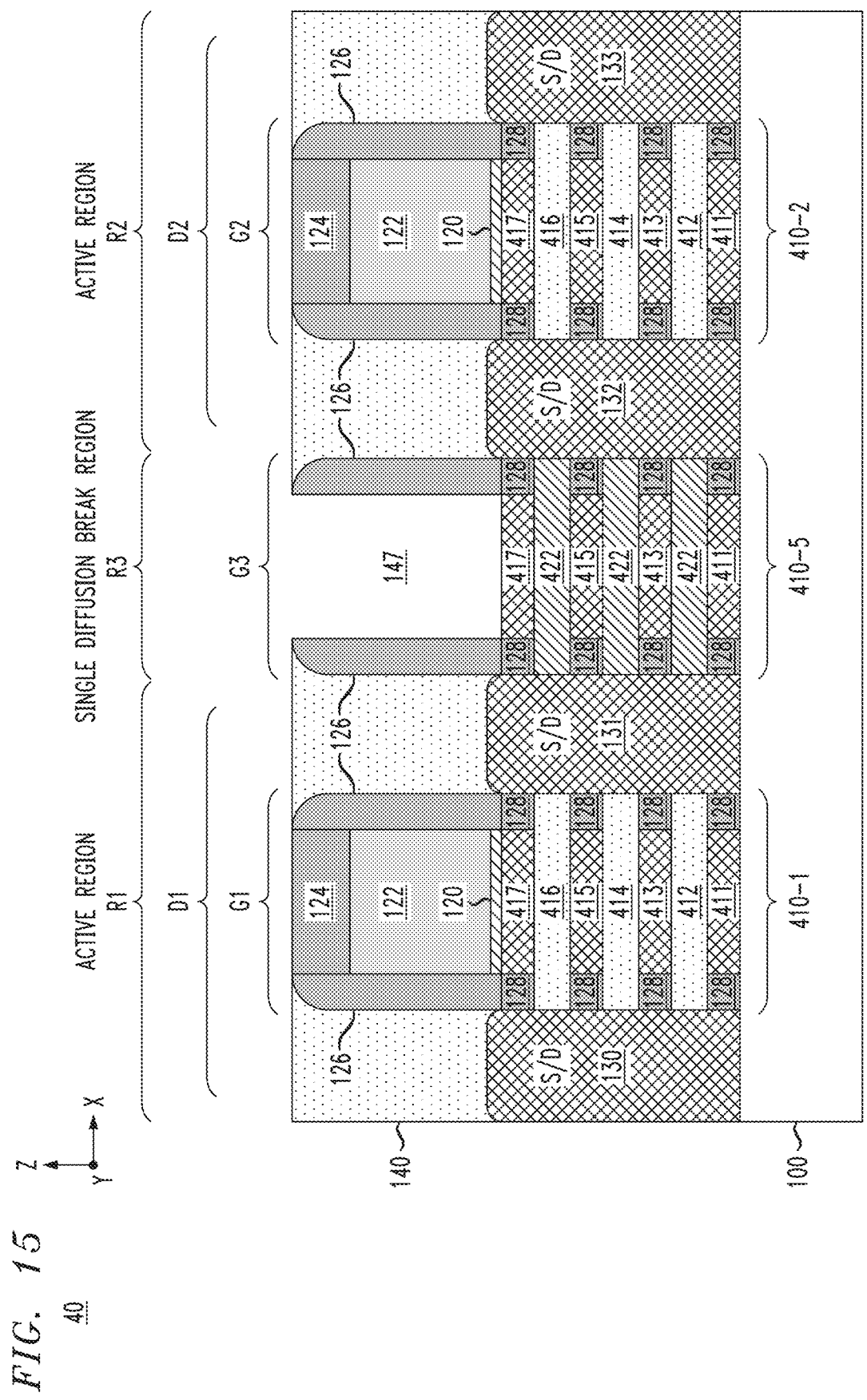

Next, FIG. 15 is a schematic cross-sectional side view of the intermediate device structure shown in FIG. 14 after forming dielectric layers 422 in the spaces 420 between the sacrificial nanowire layers 411, 413, 415, and 417. In some embodiments, the dielectric layers 422 are formed by depositing a conformal layer of dielectric material until the spaces 420 are filled with dielectric material (e.g., until pinch-off of the dielectric material occurs in the spaces 420), followed by a conformal etch back to remove the excess/overburden dielectric material from the sidewall and bottom surfaces of the open gate region 147 and the upper surface of the ILD layer 140. The dielectric material is deposited using a highly conformal deposition process, such as ALD, to ensure that the spaces 420 are sufficiently filled with dielectric material to form the dielectric layers 422. The dielectric layers 422 can be formed of the same or similar dielectric material used to form the embedded sidewall spacers 128 and/or the gate sidewall spacers 126. The overburden material of the conformal layer of dielectric material that is deposited to fill the spaces 420 and form the dielectric layers 422 can be conformally etched back using an isotropic (wet or dry) etch processes to remove the excess dielectric material.

Next, FIG. 16 is a schematic cross-sectional side view of the intermediate device structure shown in FIG. 15 after filling the open gate region 147 with insulating material 460 to thereby complete formation of a single diffusion break isolation structure 465. In some embodiments, the insulating material 460 comprises the same or similar material that forms the insulating layer 140. For example, in one embodiment, the insulating material 460 comprises silicon oxide. The open gate region 147 is filled by depositing a layer of insulating material (e.g. silicon oxide) until the open gate region 147 is filled, and then performing a CMP process to remove the overburden insulating material and planarize the surface of the semiconductor IC device down to the gate capping layers 124 of the gate structures G1 an G2, resulting in the intermediate structure shown in FIG. 16.

In the exemplary embodiment of FIG. 16, the single diffusion break isolation structure 665, which is collectively comprised of the gate sidewall spacer 126, the embedded sidewall spacers 128, the sacrificial nanowire layers 411, 413, 415, and 417 and the dielectric layers 422, serves to isolate the nanosheet FET devices D1 and D3 in the first active region R1 from the nanosheet FET devices D2 and D4 in the second active region R2. Following formation of the single diffusion break isolation structure 465, the fabrication process continues by performing a replacement metal gate process as discussed above in conjunction with FIGS. 6 and 7 to form HKMG structures of the gate structures G1 and G2.

It is to be understood that the exemplary methods discussed herein for fabricating for fabricating semiconductor integrated circuit device having single diffusion break isolation structures for isolating gate-all-around FET devices (such as nanosheet FET devices, nanowire devices, etc.) can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor integrated circuit device, comprising:
a first gate-all-around field-effect transistor device disposed in a first device region of a semiconductor substrate, wherein the first gate-all-around field-effect transistor device comprises a plurality of first active channel layers, a first gate sidewall spacer which surrounds the first active channel layers and defines a first gate region of the first gate-all-around field-effect transistor device, wherein the plurality of first active channel layers are embedded in a first work function metal layer which fills spaces between the first active channel layers, and a first gate electrode layer disposed in the first gate region above first active channel layers, and in contact with the first work function metal layer, wherein the first gate electrode layer comprises metallic material that is compositionally different from metallic material of the first work function metal layer;

a second gate-all-around field-effect transistor device disposed in a second device region of the semiconductor substrate, wherein the second gate-all-around field-effect transistor device comprises a plurality of second active channel layers, a second gate sidewall spacer which surrounds the second active channel layers and defines a second gate region of the second gate-all-around field-effect transistor device, wherein the plurality of second active channel layers are embedded in a second work function metal layer which fills spaces between the second active channel layers, and a second gate electrode layer disposed in the second gate region above second active channel layers, and in contact with the second work function metal layer, wherein the second gate electrode layer comprises metallic material that is compositionally different from metallic material of the second work function metal layer; and a single diffusion break isolation structure disposed between the first and second device regions;

wherein the single diffusion break isolation structure comprises a dummy gate structure disposed on the semiconductor substrate between a first source/drain layer of the first gate-all-around field-effect transistor device and a second source/drain layer of the second gate-all-around field-effect transistor device;

wherein the dummy gate structure comprises a first gate sidewall spacer and a second gate sidewall spacer that define a dummy gate region therebetween, and a stack of oxide layers having end portions disposed between embedded sidewall spacers of the first and second gate sidewall spacer, wherein the end portions of the oxide layers and embedded sidewall spacers are in contact with the first and second source/drain layers; and wherein a top surface of the first source/drain layer and the second source/drain layer is above a top surface of top most embedded sidewall spacers;

the semiconductor integrated circuit device further comprising a first insulating layer disposed on the first source/drain layer and extending from the first gate sidewall spacer of the first gate-all-around field-effect transistor device to the first gate sidewall spacer of the dummy gate structure, and a second insulating layer disposed on the second source/drain layer and extending from the second gate sidewall spacer of the second gate-all-around field-effect transistor device to the second gate sidewall spacer of the dummy gate structure.

2. The semiconductor integrated circuit device of claim 1, wherein the dummy gate region comprises an insulating material.

3. The semiconductor integrated circuit device of claim 1, wherein the stack of oxide layers comprises oxidized epitaxial silicon channel layers of a nanosheet stack structure.

4. The semiconductor integrated circuit device of claim 1, wherein the single diffusion break isolation structure is configured to electrically isolate the first and second source/drain layers.

5. The semiconductor integrated circuit device of claim 1, wherein the first and second gate-all-around field-effect transistor devices comprise nanosheet field-effect transistor devices.

6. The semiconductor integrated circuit device of claim 1, wherein the first and second gate-all-around field-effect transistor devices comprise nanowire field-effect transistor devices.

7. The semiconductor integrated circuit device of claim 2, wherein the insulating material comprises one of silicon nitride, silicon oxynitride, SiCOH, SiCH, and SiCNH.

8. The semiconductor integrated circuit device of claim 2, wherein the insulating material completely fills the dummy gate region.

9. The semiconductor integrated circuit device of claim 2, wherein the insulating material and the first embedded sidewall spacers comprise different materials.

10. The semiconductor integrated circuit device of claim 9, wherein the insulating material comprises silicon oxide and the embedded sidewall spacers comprise silicon nitride.

11. The semiconductor integrated circuit device of claim 2, wherein the insulating material and the embedded sidewall spacers comprise a same material.

12. The semiconductor integrated circuit device of claim 11, wherein the insulating material and the embedded sidewall spacers comprise silicon nitride.

13. The semiconductor integrated circuit device of claim 1, wherein the embedded sidewall spacers comprise one of SiN, SiBCN, SiCO, SiBCN, and SiCON.

14. The semiconductor integrated circuit device of claim 1, wherein the first gate electrode layer and the second gate electrode layer comprise at least one of tungsten, ruthenium, cobalt, copper, and aluminum.

15. The semiconductor integrated circuit device of claim 1, wherein the first and second insulating layers each comprise an interlayer dielectric layer.

* * * * *